US 11,119,376 B2

(12) United States Patent
Kawata

(10) Patent No.: US 11,119,376 B2
(45) Date of Patent: Sep. 14, 2021

(54) ELECTRO-OPTICAL DEVICE AND ELECTRONIC APPARATUS

(71) Applicant: SEIKO EPSON CORPORATION, Tokyo (JP)

(72) Inventor: Hidenori Kawata, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 112 days.

(21) Appl. No.: 16/556,304

(22) Filed: Aug. 30, 2019

(65) Prior Publication Data

US 2020/0073163 A1   Mar. 5, 2020

(30) Foreign Application Priority Data

Aug. 31, 2018  (JP) .............................. JP2018-162585

(51) Int. Cl.
| | | |
|---|---|---|
| G02F 1/1368 | (2006.01) | |
| H01L 27/12 | (2006.01) | |
| H01L 29/786 | (2006.01) | |
| G02F 1/1362 | (2006.01) | |
| G03B 21/00 | (2006.01) | |

(52) U.S. Cl.
CPC ...... *G02F 1/1368* (2013.01); *G02F 1/136286* (2013.01); *H01L 27/124* (2013.01); *H01L 27/1222* (2013.01); *H01L 27/1255* (2013.01); *H01L 29/78621* (2013.01); *H01L 29/78633* (2013.01); *H01L 29/78675* (2013.01); *G03B 21/006* (2013.01)

(58) Field of Classification Search
None
See application file for complete search history.

(56) References Cited

U.S. PATENT DOCUMENTS

| | | |
|---|---|---|
| 2004/0141130 A1 | 7/2004 | Kawata et al. |
| 2005/0199889 A1 | 9/2005 | Kawata et al. |
| 2009/0065780 A1 | 3/2009 | Yasukawa et al. |
| 2018/0067368 A1 | 3/2018 | Izawa et al. |
| 2018/0239205 A1* | 8/2018 | Yokota .............. G02F 1/133345 |

FOREIGN PATENT DOCUMENTS

| | | |
|---|---|---|
| JP | 2004-158518 A | 6/2004 |
| JP | 2004-170911 A | 6/2004 |
| JP | 2009-063957 A | 3/2009 |
| JP | 2009-063958 A | 3/2009 |
| JP | 2013-007900 A | 1/2013 |
| JP | 2018-040969 A | 3/2018 |

\* cited by examiner

*Primary Examiner* — Moazzam Hossain
*Assistant Examiner* — Stanetta D Isaac
(74) *Attorney, Agent, or Firm* — Oliff PLC

(57) ABSTRACT

An electro-optical device includes a contact hole configured to electrically connect a scanning line and a gate electrode of a TFT as a transistor, the contact hole being provided, in plan view, along a semiconductor layer of the TFT and including a body portion spaced apart from a channel region of the semiconductor layer by a first distance, and a protruded portion protruding from the body portion toward a region other than the channel region of the semiconductor layer, and spaced apart from the region other than the channel region by a second distance, which is less than the first distance.

15 Claims, 11 Drawing Sheets

ELECTRO-OPTICAL DEVICE AND ELECTRONIC APPARATUS

The present application is based on, and claims priority from JP Application Serial Number 2018-162585, filed Aug. 31, 2018, the present disclosure of which is hereby incorporated by reference herein in its entirety.

BACKGROUND

1. Technical Field

The present disclosure relates to an electro-optical device, and an electronic apparatus.

2. Related Art

Examples of the electro-optical device include an active drive type liquid crystal device including, for example, a transistor having a Lightly Doped Drain (LDD) structure as a switching element in a pixel. When such a liquid crystal device is used as a light modulating unit of, for example, a projection-type display device (projector), intensive light is incident on the pixel from a light source, as compared to when the device is used as a typical display device. The light have been incident on the pixel is partially incident on the semiconductor layer of the transistor, in particular, on the LDD region, then, an optical leakage current readily occurs to cause the operation of the transistor to become unstable, making it impossible to provide a desired display state. Under such a circumstance, a light-shielding structure for blocking light being incident on the transistor is installed in the active drive type liquid crystal device.

For example, JP-A-2009-63957 discloses an electro-optical device that includes a transistor including a semiconductor film disposed to interpose a gate insulating film with a scanning line, and a gate electrode disposed to interpose the gate insulating film with a channel region of the semiconductor film, wherein a contact hole that electrically couples the scanning line and the gate electrode includes a body portion disposed at a side of the channel region of the semiconductor film, and a first extending portion extending along the semiconductor film from the body portion relative to a first portion region that includes a first coupling portion electrically coupled to a pixel electrode in a pixel electrode side source drain region of the semiconductor film and a second junction region between the channel region and the pixel electrode side source drain region. In addition, an example is described, in which the first extending portion is partially and continuously provided around the semiconductor film to surround the first portion region of the semiconductor film.

In such an electro-optical device of JP-A-2009-63957, the transistor, which is disposed, on the substrate, on the upper layer side of the scanning line, causes light traveling from the lower layer side to the semiconductor film of the transistor to be blocked by the scanning line. In addition, the contact hole, which electrically couples the scanning line and the gate electrode, includes the body portion and the first extending portion, and thus makes it possible to reduce light traveling from the upper layer side (or the lower layer side) and the side surface side of the second junction region toward the second junction region having a relative tendency of readily occurring of an optical leakage current compared to a first junction region between the channel region and the data line side source drain region. Moreover, the contact hole makes it possible to reduce light traveling from the upper layer side (or the lower layer side) and the side surface side of the pixel electrode side source drain region toward the pixel electrode side source drain region, to thus reliably prevent such light from being irradiated to the second junction region.

Unfortunately, the contact hole of the electro-optical device in LP-A-2009-63957 is still insufficiently configured to have a light-shielding property with respect to the transistor. Specifically, light incident on the pixel from the substrate side is diffracted at the end portion of the scanning line, to thus cause an occurring of diffracted light going around the scanning line. A problem that remained is that such diffracted light enters the gap between the body portion of the contact hole and the semiconductor film in plan view, and is then incident on the semiconductor film to also generate an optical leakage current.

SUMMARY

An electro-optical device according to the present application includes a substrate, a transistor, a scanning line between the substrate and the transistor, and an insulating layer including a contact hole configured to electrically couple the scanning line and a gate electrode of the transistor, wherein the contact hole includes a body portion provided, in plan view, along a semiconductor layer of the transistor and spaced apart from a channel region of the semiconductor layer by a first distance, and a protruded portion configured to protrude from the body portion toward a region other than the channel region of the semiconductor layer and to be spaced apart from the region other than the channel region by a second distance, which is less than the first distance.

In the electro-optical device described above, the contact hole may be provided, in plan view, on both sides of the semiconductor layer.

In the electro-optical device described above, the semiconductor layer may include the channel region, low concentration impurity regions provided to interpose the channel region therebetween and a high concentration impurity region provided in contact with the low concentration impurity region, and the protruded portion in the contact hole may protrude toward the high concentration impurity region side of a boundary between the low concentration impurity region and the high concentration impurity region.

In the electro-optical device described above, the semiconductor layer may include the channel region, low concentration impurity regions provided to interpose the channel region therebetween, and a high concentration impurity region provided in contact with the low concentration impurity region, and the protruded portion in the contact hole may protrude toward a region extending across the low concentration impurity region and the high concentration impurity region.

In the electro-optical device described above, a light-absorption layer may be provided inside the contact hole.

In the electro-optical device described above, the light-absorption layer may include an oxide of a metal selected from among Ti, Zr, and Hf, and the oxide of the metal may be provided along a side wall inside the contact hole.

In the electro-optical device described above, a light-absorption layer may be provided between the scanning line and the insulating layer on the substrate of the electro-optical device.

In the electro-optical device described above, the light-absorption layer provided between the scanning line and the insulating layer may include an oxide of a metal selected from among Ti, Zr, and Hf, and the oxide of the metal may be provided only at an interface between the scanning line and the insulating layer.

The electro-optical device described above may include a conductive layer covering the light-absorption layer inside the contact hole.

In the electro-optical device described above, a void may be formed inside the contact hole.

An electronic apparatus according to the present application includes the electro-optical device described above.

DESCRIPTION OF EXEMPLARY EMBODIMENTS

Figure 1:
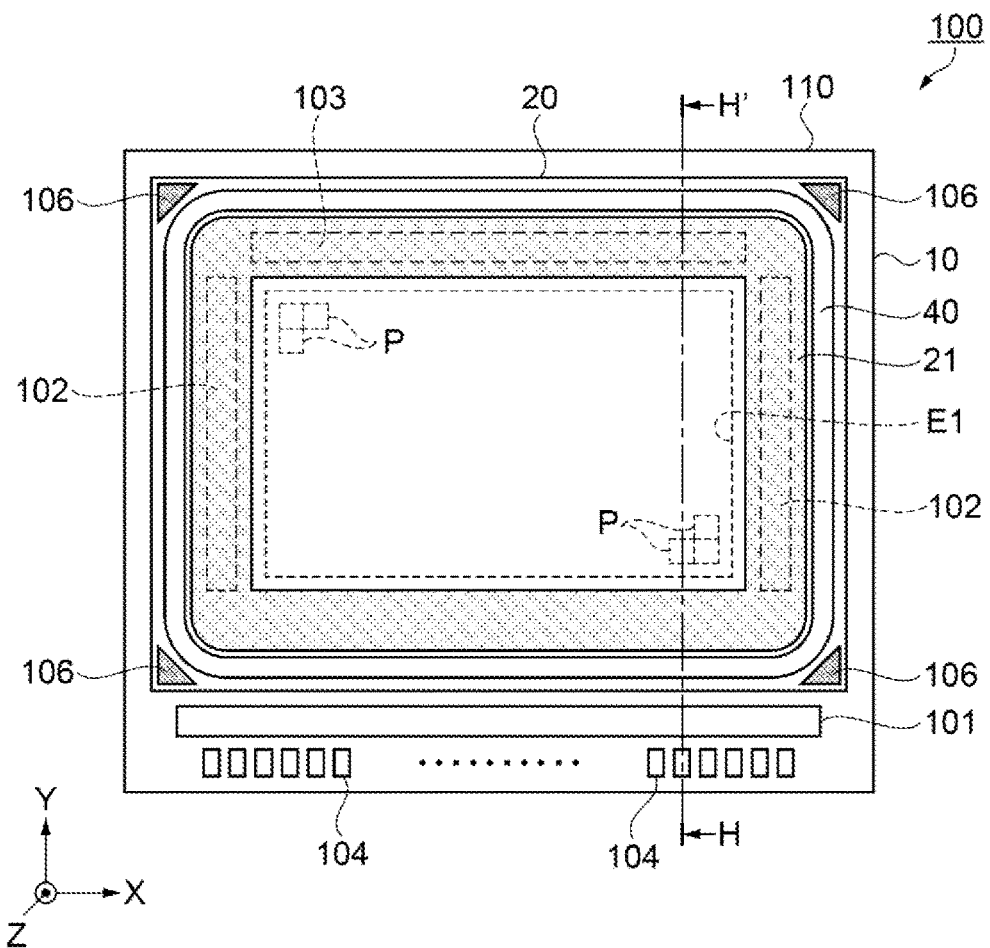
FIG. 1 is a plan view schematically illustrating a configuration of a liquid crystal device as an electro-optical device according to First Exemplary Embodiment.

Hereinafter, exemplary embodiments of the present disclosure will be described below with reference to the accompanying drawings. Note that, in the drawings referred to below, the parts described are illustrated in an enlarged or reduced state as appropriate so that those parts can be easily recognized.

In the exemplary embodiments, an active drive type liquid crystal device including a Thin Film Transistor (TFT) being a switching element for each of the pixels will be described as an example of an electro-optical device. The liquid crystal device is a compact display device favorably usable for light modulation unit (liquid crystal light valve) of, for example, a projection-type display device (liquid crystal projector) described below.

FIRST EXEMPLARY EMBODIMENT

Electro-Optical Device

Figure 2:
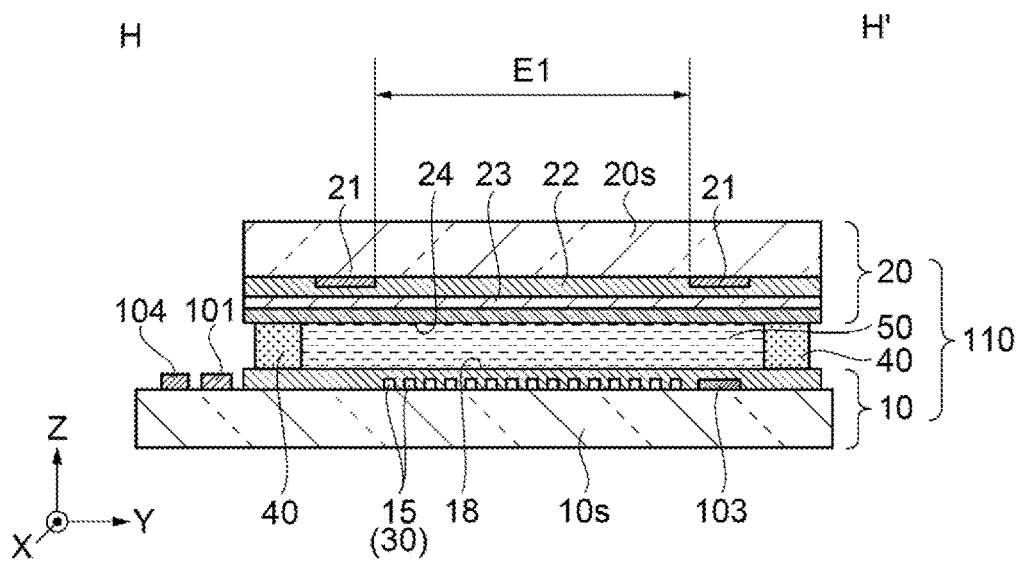
FIG. 2 is a cross-sectional view schematically illustrating a structure of a liquid crystal device taken along line H-H' in FIG. 1.
Figure 3:
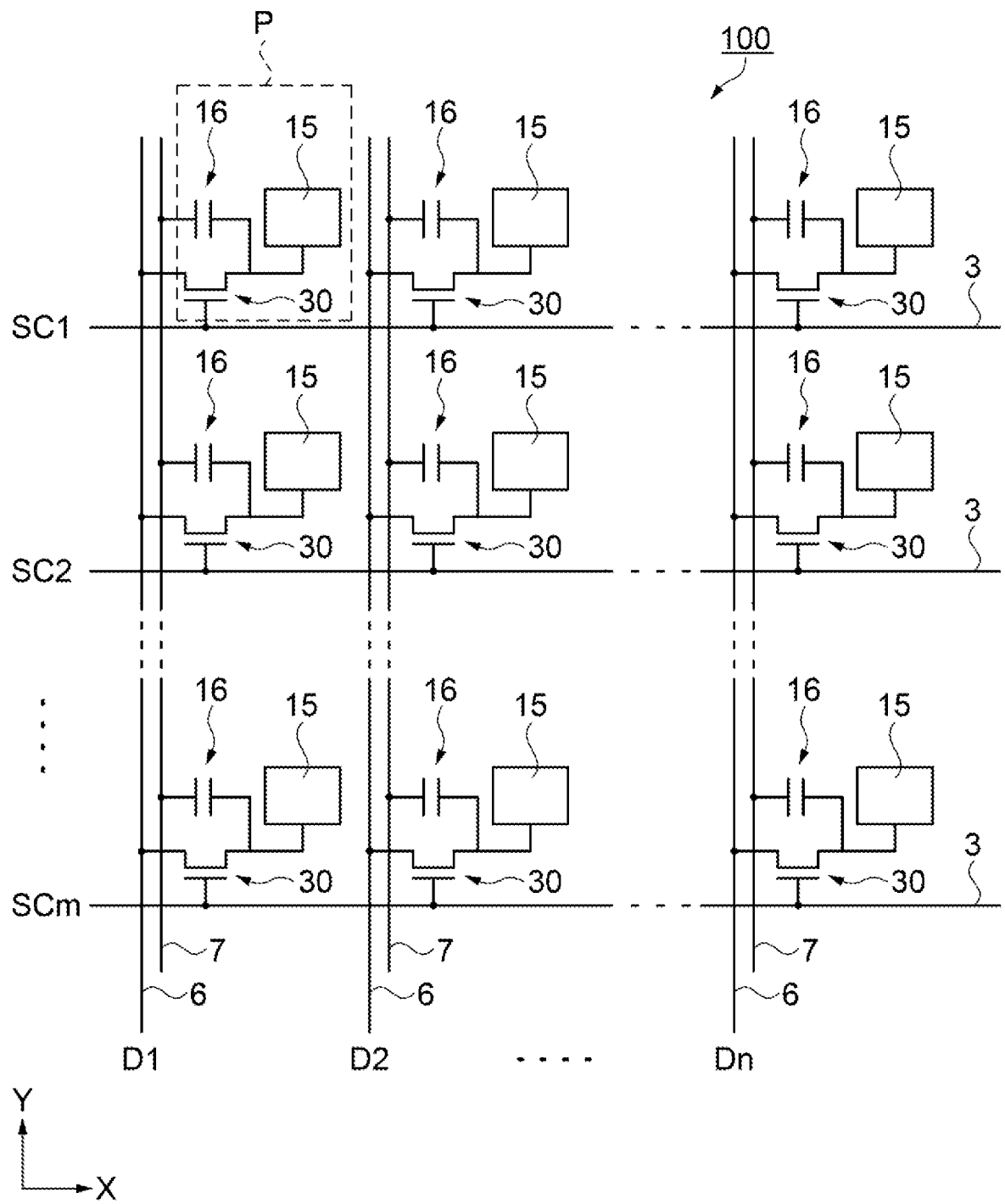
FIG. 3 is an equivalent circuit diagram illustrating an electrical configuration of a liquid crystal device.

First, a configuration of a liquid crystal device as an electro-optical device according to First Exemplary Embodiment will be described with reference to FIGS. 1 to 3. FIG. 1 is a plan view schematically illustrating a configuration of a liquid crystal device as an electro-optical device, and FIG. 2 is a cross-sectional view schematically illustrating a structure of the liquid crystal device taken along line H-H' in FIG. 1. FIG. 3 is an equivalent circuit diagram illustrating an electrical configuration of the liquid crystal device.

As illustrated in FIGS. 1 and 2, a liquid crystal device 100 serving as the electro-optical device of First Exemplary Embodiment includes a liquid crystal panel 110 provided with an element substrate 10 and a counter substrate 20 disposed facing each other, and a liquid crystal layer 50 sandwiched by a pair of these substrates. For example, a transparent quartz substrate or glass substrate is used for each of a base material 10s of the element substrate 10 and a base material 20s of the counter substrate 20. The base material 10s of the element substrate 10 is an example of the substrate in the present disclosure.

The element substrate 10 has a size larger than the counter substrate 20, and both substrates are bonded together with a spacing and being intervened by a sealing portion 40 disposed along an outer edge of the counter substrate 20. A liquid crystal is injected into the inner side of the sealing portion 40 disposed in a frame shape, to thus configure the liquid crystal layer 50. Note that the method of injecting a liquid crystal in the above-described spacing includes, for example, a One Drop Fill (ODF) method, in which a liquid crystal are dripped into the inner side of the sealing portion 40 disposed in a frame shape, and then the element substrate 10 and the counter substrate 20 are bonded together under a reduced pressure.

For the sealing portion 40, an adhesive such as a thermo-setting or ultraviolet curable epoxy resin can be used, for example. In First Exemplary Embodiment, an ultraviolet curable type epoxy resin is used. A spacer (not illustrated) is included for the sealing portion 40 to keep the spacing between the pair of substrates constant.

A display region E1 in which a plurality of pixels P are arrayed in a matrix pattern is provided at the inner side of the sealing portion 40. In addition, a partition portion 21 with light-shielding properties is provided surrounding the display region E1, between the sealing portion 40 and the display region E1. The partition portion 21 includes, for example, a metal or a metal oxide having a light-shielding property. Note that the display region E1 may include a plurality of dummy pixels, in addition to the plurality of operative pixels P that contribute to the display.

The element substrate 10 is provided with a terminal portion in which a plurality of external coupling terminals 104 are aligned. A data line drive circuit 101 is provided between a first side portion along the terminal portion and the sealing portion 40. In addition, an inspection circuit 103 is provided between the sealing portion 40 along a second side portion facing the first side portion and the display region E1. Moreover, scanning line drive circuits 102 are provided between the sealing portion 40 along a third side portion and a fourth side portion orthogonal to the first side portion and facing each other, and the display region E1. Between the sealing portion 40 of the second side portion and the inspection circuit 103, there are provided a plurality of wiring lines (not illustrated) that links two scanning line drive circuits 102.

The wiring lines (not illustrated) linked to the data line drive circuit 101 and the scanning line drive circuit 102 are coupled to the plurality of external coupling terminals 104 aligned along the first side portion. Note that the arrangement of the inspection circuit 103 is not limited to the above, and may be provided at a position along the inner side of the sealing portion 40 between the data line drive circuit 101 and the display region E1.

Hereinafter, descriptions will be given assuming that a direction along the first side portion is an X direction, and a direction along the third side portion is a Y direction. Further, a direction orthogonal to both the X direction and the Y direction and oriented from the element substrate 10 toward the counter substrate 20 is described as a Z direction. In addition, viewing along the Z direction from the counter substrate 20 toward the element substrate 10 is referred to as plan view or planarly (planar).

As illustrated in FIG. 2, a light-transmitting pixel electrode 15 and a thin film transistor (hereinafter referred to as TFT) 30 being a switching element, provided for each of the pixels P, a signal wiring line, and an alignment film 18 covering these components are arranged on a surface of the element substrate 10 on the liquid crystal layer 50 side. The element substrate 10 includes the base material 10s, and the pixel electrode 15, the TFT 30, the signal wiring line, and the alignment film 18 that are arranged on the base material 10s. A detailed configuration of the element substrate 10 will be described below.

The counter substrate 20 disposed facing the element substrate 10 includes a base material 20s, a partition portion 21 provided on the base material 20s, a planarization layer 22 film formed covering the partition portion 21, a counter electrode 23 covering the planarization layer 22, provided over substantially the entire surface of the substrate 20s, and serving as a common electrode, and an alignment film 24 covering the counter electrode 23.

As illustrated in FIG. 1, the partition portion 21 is provided surrounding the display region E1, also at a position planarly overlapping with the scanning line drive circuit 102 and the inspection circuit 103. This causes the partition portion 21 to block light incident on these circuits from the counter substrate 20 side, and to thus serve to prevent these circuits from malfunctioning due to the light. In addition, the partition portion 21 blocks light to prevent unnecessary stray light from being incident on the display region E1, and ensures high contrast in the display of the display region E1. Note that in First Exemplary Embodiment, the sealing portion 40 is formed using an ultraviolet curable type epoxy resin, and thus the partition portion 21 is disposed not to overlap with the sealing portion 40 in plan view. Accordingly, a gap (see FIG. 1), which is a slight gap, is provided in view of the positional accuracy of the bonding between the element substrate 10 and the counter substrate 20 and the ultraviolet light curing properties of the sealing portion 40.

The planarization layer 22 includes, for example, an inorganic material such as a silicon oxide, has an optical transparency, and is provided to cover the partition portion 21. The planarization layer 22 thus configured may be formed by a film formation method using, for example, a plasma Chemical Vapor Deposit (CVD) method or the like.

The counter electrode 23 includes, for example, a transparent conductive film such as an Indium Tin Oxide (ITO) film. The counter electrode 23 covers the planarization layer 22 and is electrically coupled to vertical conducting portions 106 provided on four corners of the counter substrate 20, as illustrated in FIG. 1. The vertical conduction portion 106 is electrically coupled to the wiring line on the element substrate 10 side.

The alignment film 18 covering the pixel electrode 15 and the alignment film 24 covering the counter electrode 23 are selected based on an optical design of the liquid crystal device 100. The alignment films 18 and 24 are, for example, an organic alignment film formed such that an organic material such as polyimide is film formed, and the surface of the film is rubbed to cause the film to be subjected to substantially horizontal alignment treatment with respect to liquid crystal molecules having positive dielectric anisotropy, or an inorganic alignment film formed such that an inorganic material such as SiOx (silicon oxide) is film formed using a vapor phase growth method, and is then aligned substantially vertically with respect to liquid crystal molecules having negative dielectric anisotropy.

The liquid crystal device 100 thus configured is of a transmissive-type and, the design employed is an optical design of a normally white mode in which the transmittance of the pixel P is maximized under a state of voltage being not applied, and a normally black mode in which the transmittance of the pixel P is minimized under a state of voltage being not applied. A light-polarization element is disposed to be used, on each of a light incidence side and a light exit side of the liquid crystal panel 110 including the element substrate 10 and the counter substrate 20, in accordance with the optical design.

In First Exemplary Embodiment, an example is described, in which the optical design of the normally black mode is applied, using the inorganic alignment films as the alignment films 18 and 24, and a liquid crystal material having negative dielectric anisotropy.

Next, an electrical configuration of the liquid crystal device 100 (the liquid crystal panel 110) will be described with reference to FIG. 3. The liquid crystal device 100 includes a plurality of scanning lines 3 and a plurality of data lines 6 as signal wiring lines insulated from one another and orthogonal to one another at least in the display region E1, and a capacitance line 7 disposed in parallel with the data line 6. The direction in which the scanning line 3 extends is the X direction, and the direction in which the data line 6 extends is the Y direction.

The scanning line 3, the data line 6, the capacitance line 7, and the pixel electrode 15, the TFT 30, and a storage capacitor 16 in each of the regions partitioned by the scanning lines 3, the data lines 6, and the capacitance lines 7 are provided, where these wiring lines and components constitute a pixel circuit of the pixel P.

The scanning line 3 is electrically coupled to a gate of the TFT 30, and the data line 6 is electrically coupled to a source of the TFT 30. The pixel electrode 15 is electrically coupled to the drain of the TFT 30.

With the data lines 6 being coupled to the data line drive circuit 101 (see FIG. 1), image signals D1, D2, . . . , and Dn, which are supplied from the data line drive circuit 101, are supplied to the pixels P. With the scanning lines 3 being coupled to the scanning line drive circuit 102 (see FIG. 1), scanning signals SC1, SC2, . . . , and SCm, which are supplied from the scanning line drive circuit 102, are supplied to the pixels P.

The image signals D1 to Dn supplied from the data line drive circuit 101 to the data lines 6 may be line-sequentially supplied in this order, or may be supplied to the plurality of respective data lines 6 adjacent to each other in groups. The scanning line drive circuit 102 line-sequentially supplies the scan signals SC1 to SCm to the scanning lines 3 in a pulsed manner at predetermined timings.

The liquid crystal device 100 is configured such that as the TFT 30—a switching element—is turned to be on state only for a certain period by an input of the scan signals SC1 to SCm, the image signals D1 to Dn supplied from the data lines 6 are written in the pixel electrodes 15 at predetermined timings. The image signals D1 to Dn of a predetermined level written into the liquid crystal layer 50 via pixel electrodes 15 are held for a certain period between the pixel electrodes 15 and the counter electrode 23, which are arranged to face the pixel electrodes 15 being intervened by the liquid crystal layer 50. The frequency of the image signals D1 to Dn is 60 Hz, for example.

To prevent the image signals D1 to Dn held from leaking, the storage capacitor 16 is coupled in parallel with liquid crystal capacitor formed between the pixel electrode 15 and the counter electrode 23. The storage capacitor 16 is provided between the drain of the TFT 30 and the capacitance line 7.

Note that although the inspection circuit 103 illustrated in FIG. 1 is coupled to the data lines 6, and is configured to be capable of detecting the image signals described above to confirm operational defects and the like of the liquid crystal device 100 in a manufacturing process of the liquid crystal device 100, the above configuration is omitted in the equivalent circuit of FIG. 3.

The peripheral circuit configured to drive and control the pixel circuit in First Exemplary Embodiment includes the data line drive circuit 101 and the scanning line drive circuit 102. In addition, the peripheral circuit may include a sampling circuit configured to sample the image signals described above and to supply the image signals to the data lines 6, and a precharge circuit configured to supply precharge signals at predetermined voltage level to the data lines 6 in advance of the supply of the image signals.

Structure of Pixel

Figure 4:
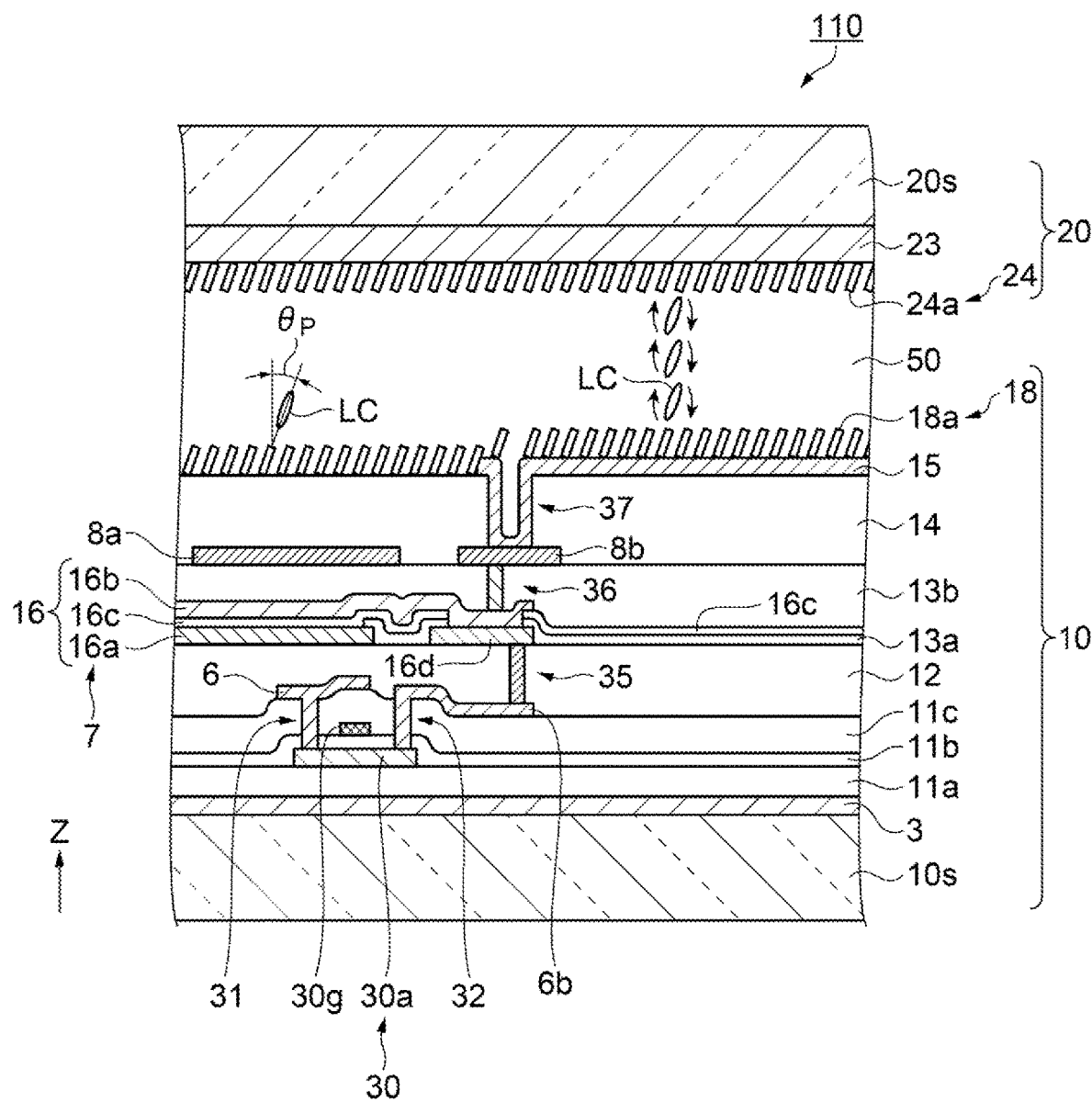
FIG. 4 is a cross-sectional view schematically illustrating a structure of a pixel of a liquid crystal device.

Next, a structure of the pixel P in the liquid crystal device 100 (the liquid crystal panel 110) in First Exemplary Embodiment will be described. FIG. 4 is a cross-sectional view schematically illustrating a structure of a pixel of a liquid crystal device.

As illustrated in FIG. 4, the scanning line 3 is firstly formed on the base material 10s of the element substrate 10. The scanning line 3 is configured to include a barrier layer formed using a metal silicide as an oxide free metal compound of a metal selected from among chromium (Cr), tungsten (W), and molybdenum (Mo), and a metal layer formed using a metal selected from among titanium (Ti), zirconium (Zr), and hafnium (Hf).

An underlying insulating layer 11a including a material such as a silicon oxide, for example, is formed covering the scanning line 3, and on the underlying insulating layer 11a, a semiconductor layer 30a is provided in an island form. The semiconductor layer 30a is composed of, for example, a polycrystalline silicon film and impurity ions are selectively implanted into the polycrystalline silicon film, and thus a Lightly Doped Drain (LDD) structure is formed, which includes a channel region, a low concentration impurity region that interposes the channel region, and a high concentration impurity region in contact with the low concentration impurity region.

The light incident on the semiconductor layer 30a from the base material 10s side is blocked by the scanning line 3 due to the semiconductor layer 30a provided above the scanning line 3 having a light-shielding property. This prevents a generation of an optical leakage current in the TFT 30 due to the incident light, and prevents the operation from becoming unstable.

A gate insulating layer 11b is provided to cover the semiconductor layer 30a. A gate electrode 30g is further provided at a position facing the channel region with the gate insulating layer 11b interposed in between. In First Exemplary Embodiment, a part of the wiring line electrically coupled to the scanning line 3 serves as the gate electrode 30g. An electrical coupling between the scanning line 3 and the gate electrode 30g, and a detailed configuration of the gate electrode 30g will be described below.

A first interlayer insulating layer 11c is formed to cover the gate electrode 30g and the gate insulating layer 11b, and two through holes are formed through the gate insulating layer 11b and the first interlayer insulating layer 11c at positions overlapping with the respective end portions of the semiconductor layer 30a.

Further, an conductive film having a light-shielding property such as aluminum (Al), or an alloy or metal compound of Al, an impurity doped polysilicon, or the like, is film formed to fill the two through holes and covering the first interlayer insulating layer 11c, and the conductive film is patterned to form the data line 6 linked to the source of the TFT 30 via a contact hole 31. Concurrently with the above, a first relay electrode 6b linked to the drain of the TFT 30 via a contact hole 32 is formed.

Next, a second interlayer insulating layer 12 is formed covering the data line 6, the first relay electrode 6b, and the first interlayer insulating layer 11c. The second interlayer insulating layer 12 includes silicon oxide, for example. A planarization treatment is performed to planarize the unevenness of the surface occurred by covering of the region in which the TFTs 30 are provided. Examples of the planarization treatment include Chemical Mechanical Polishing treatment (CMP treatment), etching treatment, and a method in which these treatments are performed in a combined manner.

A through hole is formed through the second interlayer insulating layer 12 at a position planarly overlapping with the first relay electrode 6b. A conductive film having a light-shielding property, such as aluminum (Al), or an alloy or metal compound of Al, is formed covering the through hole and covering the second interlayer insulating layer 12, and the conductive film is patterned to form a first capacitor electrode 16a, and a second relay electrode 16d electrically coupled to the first relay electrode 6b via a contact hole 35.

A protective insulating layer 13a is formed being patterned to cover an outer edge of a portion of the first capacitor electrode 16a, where the portion faces a second capacitor electrode 16b with intervening a dielectric layer 16c that will be formed afterward. The protective insulating layer 13a is formed being patterned to cover an outer edge of the second relay electrode 16d excluding the portion overlapping with a contact hole 36 to be described below. The protective insulating layer 13a is provided to prevent the first capacitor electrode 16a from being etched in patterning of the second capacitor electrode 16b that is subsequently formed.

Next, a dielectric layer 16c is film formed, which covers the protective insulating layer 13a and the first capacitor electrode 16a. The dielectric layer 16c may be formed using a single layer film such as a silicon nitride film, hafnium oxide ($HfO_2$), alumina ($Al_2O_3$), tantalum oxide ($Ta_2O_5$), or the like, or a multilayer film in which at least two types of single-layer film of these single layer films are layered. The dielectric layer 16c at a portion planarly overlapping with the second relay electrode 16d is etched and removed. A conductive film, such as titanium nitride (TiN), for example, is formed covering the dielectric layer 16c, and the conductive film is patterned to form the second capacitor electrode 16b that faces the first capacitor electrode 16a and is linked to the second relay electrode 16d. A storage capacitor 16 is configured with the dielectric layer 16c, and the first capacitor electrode 16a and the second capacitor electrode 16b disposed facing each other with the dielectric layer 16c interposed in between.

Next, a third interlayer insulating layer 13b is formed covering the second capacitor electrode 16b and the dielectric layer 16c. The third interlayer insulating layer 13b also includes silicon oxide, for example, and is subjected to a planarization treatment such as CMP treatment. The film thickness of the protective insulating layer 13a and the dielectric layer 16c is thinner than the film thickness of the third interlayer insulating layer 13b. In addition, the protective insulating layer 13a and the dielectric layer 16c are not necessarily be formed over the entire surface of the base material 10s, and may be patterned in accordance with the configuration of the storage capacitor 16.

A through hole is formed through the third interlayer insulating layer 13b to reach a portion of the second capacitor electrode 16b, which is in contact with the second relay electrode 16d.

An conductive film having a light-shielding property such as aluminum (Al), or an alloy or metal compound of Al, is formed to cover the through hole and to cover the third interlayer insulating layer 13b, and the conductive film is patterned to form a wiring line 8a, and a third relay electrode 8b electrically coupled to the second relay electrode 16d via the contact hole 36. The wiring line 8a is formed planarly overlapping with the semiconductor layer 30a of the TFT 30, the data line 6, and the storage capacitor 16, and serves as a shield layer to which a fixed potential is applied.

A fourth interlayer insulating layer 14 is formed to cover the wiring line 8a and the third relay electrode 8b. The fourth interlayer insulating layer 14 can also be formed, for example, using a silicon oxide. A through hole is formed through the fourth interlayer insulating layer 14 to reach the third relay electrode 8b.

A transparent conductive film (electrode film) such as ITO is formed covering the through hole and covering the fourth interlayer insulating layer 14. The transparent conductive film (electrode film) is patterned to form a pixel electrode 15 that is electrically linked to the third relay electrode 8b via a contact hole 37.

The third relay electrode 8b is electrically coupled to the second source/drain region (drain) of the TFT 30 via the contact hole 36, the second capacitor electrode 16b, the second relay electrode 16d, the contact hole 35, and the first relay electrode 6b, and is electrically coupled to the pixel electrode 15 via the contact hole 37.

The first capacitor electrode 16a is formed across a plurality of pixels P, and serves as the capacitance line 7 in the equivalent circuit (see FIG. 3). The first capacitor electrode 16a is applied with a fixed potential. This enables the electric potential supplied to the pixel electrode 15 via the second source/drain region (drain) of the TFT 30 to be held between the first capacitor electrode 16a and the second capacitor electrode 16b.

An alignment film 18 is formed covering the pixel electrode 15, and an alignment film 24 is formed covering the counter electrode 23 of the counter substrate 20 disposed facing the element substrate 10 via the liquid crystal layer 50. The alignment films 18 and 24 are inorganic alignment films as described above, and are formed of an aggregate of columnar bodies 18a and 24a, respectively, which are grown in a columnar shape by diagonally depositing of an inorganic material such as silicon oxide from a predetermined direction, for example. The liquid crystal molecules LC having negative dielectric anisotropy with respect to the alignment films 18 and 24 thus configured, have a pretilt angle θp of 3 to 5 degrees in the inclination direction of the columnar bodies 18a and 24a and is substantially aligned vertically (VA: Vertical Alignment), with respect to the normal direction of the alignment film surface. By applying an alternating voltage (drive signal) between the pixel electrode 15 and the counter electrode 23 to drive the liquid crystal layer 50, the liquid crystal molecules LC behaves (vibrates) to tilt in the electric field direction occurred between the pixel electrode 15 and the counter electrode 23.

As such, on the base material 10s of the element substrate 10, a plurality of wiring layers in which the scanning line 3, the TFT 30, the data lines 6, the storage capacitor 16, the shielding layer (the wiring line 8a), the pixel electrode 15, and the like are disposed, is provided. Among the plurality of wiring layers, the wiring layer according to the light-shielding structure of the TFT 30 of First Exemplary Embodiment is a portion of the lower layers lower than the data line 6, and a structure of wiring layers of a related art can be applied to the configuration of the upper layers upper than the data line 6, without being particularly limited.

Configuration and Arrangement of Pixel

Figure 5:
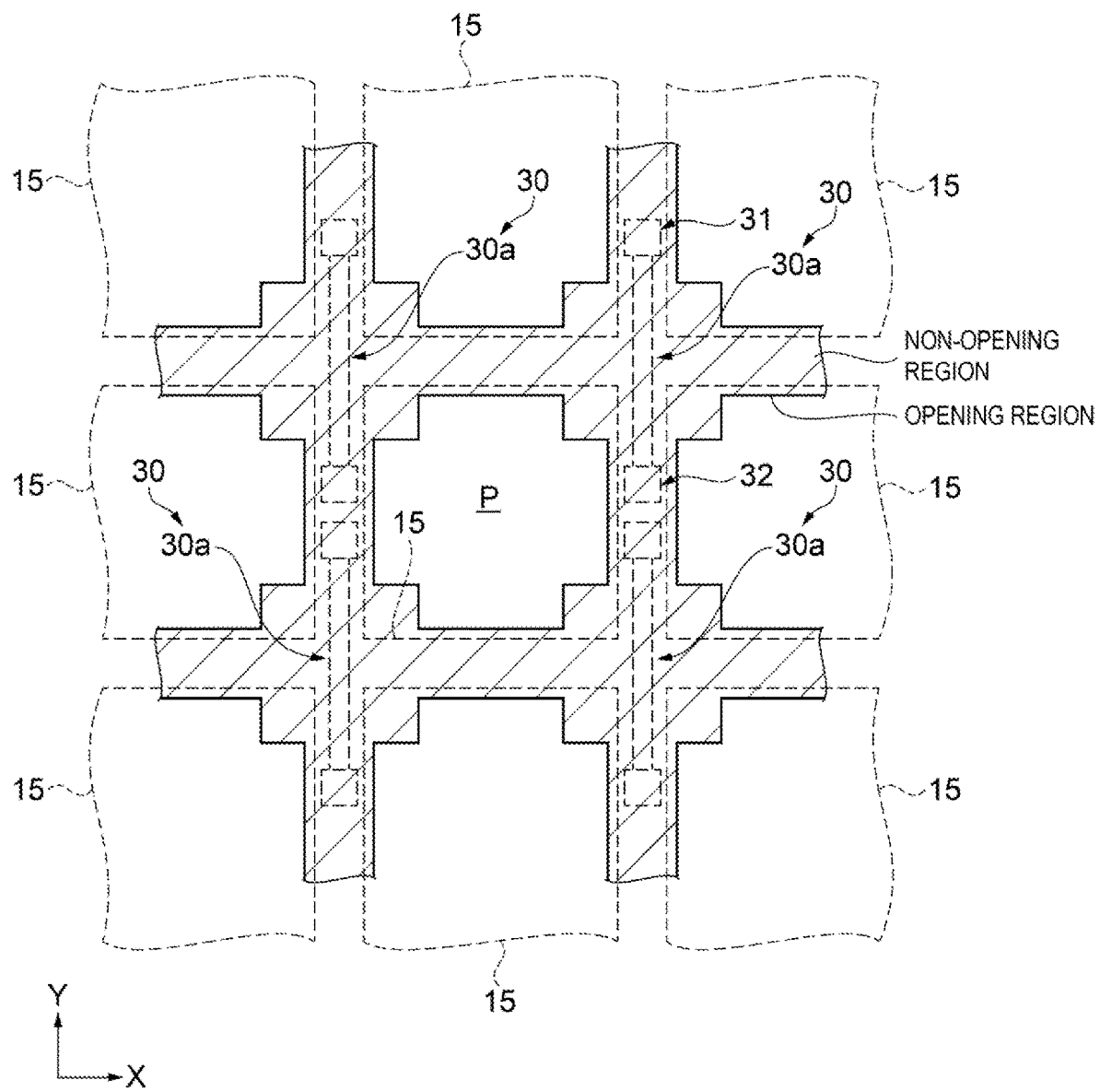
FIG. 5 is a plan view schematically illustrating a main configuration of a pixel and a relationship between an opening region and a non-opening region.

Next, a planar arrangement of a main configuration in the pixel P will be described with reference to FIG. 5. FIG. 5 is a plan view schematically illustrating a main configuration of a pixel and a relationship between an opening region and a non-opening region.

As illustrated in FIG. 5, the pixel P in the liquid crystal device 100 includes an opening region having, for example, a substantially quadrangle shape (substantially square shape) in plan view. The opening region is surrounded by non-opening regions each having a light-shielding property and extending in the X direction and in the Y direction to be provided in a lattice pattern.

In the non-opening regions extending in the X direction, the scanning lines 3 illustrated in FIGS. 3 and 4 are provided. A conductive member having a light-shielding property is used for the scanning lines 3, and the non-opening region partially constituted by the scanning lines 3.

Similarly, in the non-opening regions extending in the Y direction, the data lines 6 and the capacitance lines 7 (the first capacitor electrodes 16a) illustrated in FIGS. 3 and 4 are provided. The conductive member having a light-shielding property is also used for each of the data lines 6 and the capacitance lines 7 (the first capacitor electrodes 16a), and these components constitute a part of the non-opening regions.

At an intersection of the non-opening regions, the TFT 30 illustrated in FIGS. 3 and 4 are provided. In First Exemplary Embodiment, the semiconductor layer 30a of the TFT 30 is disposed extending in the Y direction at the intersection of the non-opening regions. The contact hole 31 configured for coupling the semiconductor layer 30a and the data line 6, and the contact hole 32 configured for coupling the semiconductor layer 30a and the first relay electrode 6b are also provided at the non-opening region. The TFT 30 thus provided at the intersection of the non-opening regions having a light-shielding property ensures an aperture ratio in the opening regions. The widths of the intersections of the non-opening regions are set greater than the widths of other portions, because the TFT 30 is provided at the intersection. Note that, at the intersection of the non-opening regions, the semiconductor layer 30a is disposed extending in the Y direction, but without being limited to this, the semiconductor layer 30a may be disposed extending in the X direction. Accordingly, the intersection of the non-opening regions may be shaped corresponding to the arrangement of the TFT 30, and may not protrude to the opening region side evenly in the X direction and in the Y direction.

The pixel electrode 15 is provided for each of the pixels P. The pixel electrode 15 has a substantially square shape in plan view, and is provided in the opening region to cause an outer edge of the pixel electrode 15 to overlap with the non-opening regions. Note that, although not illustrated in FIG. 5, the storage capacitor 16, the wiring line 8a, and the like illustrated in FIG. 4 are also disposed in the non-opening regions.

The liquid crystal device 100 of First Exemplary Embodiment is of a transmissive-type and is configured assuming that light is incident from the counter substrate 20 side. The light incident from the counter substrate 20 side, passing through the liquid crystal layer 50, and incident on the pixel P of the element substrate 10 may be partially reflected by the wiring line and the like described above provided on the element substrate 10, and may proceed toward the TFT 30. In addition, as described above, the light transmitting through the pixel P and emitted from the element substrate 10 may be reflected by a surface of a structural body such as a light-polarization element disposed on the emission side of the light with respect to the element substrate 10, to be incident on the element substrate 10 again. The element substrate 10 of First Exemplary Embodiment incorporates a light-shielding structure that blocks light incident on the TFT 30 of the pixel P. Hereinafter, the light-shielding structure of the TFT 30 in the element substrate 10 will be described in detail.

Light-Shielding Structure of Transistor

Figure 6:
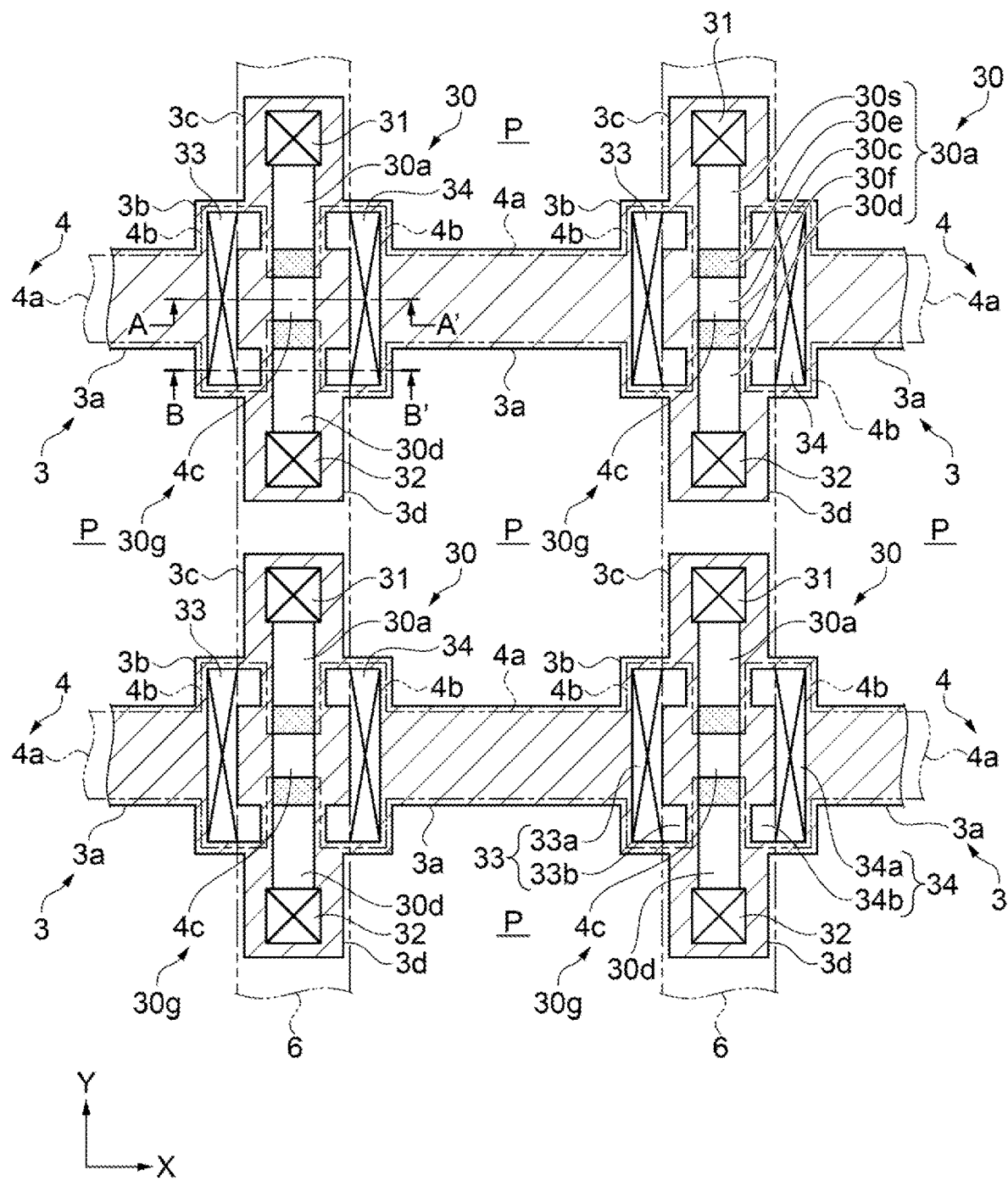
FIG. 6 is a plan view schematically illustrating an arrangement of transistors and signal wiring lines in an element substrate.
Figure 7:
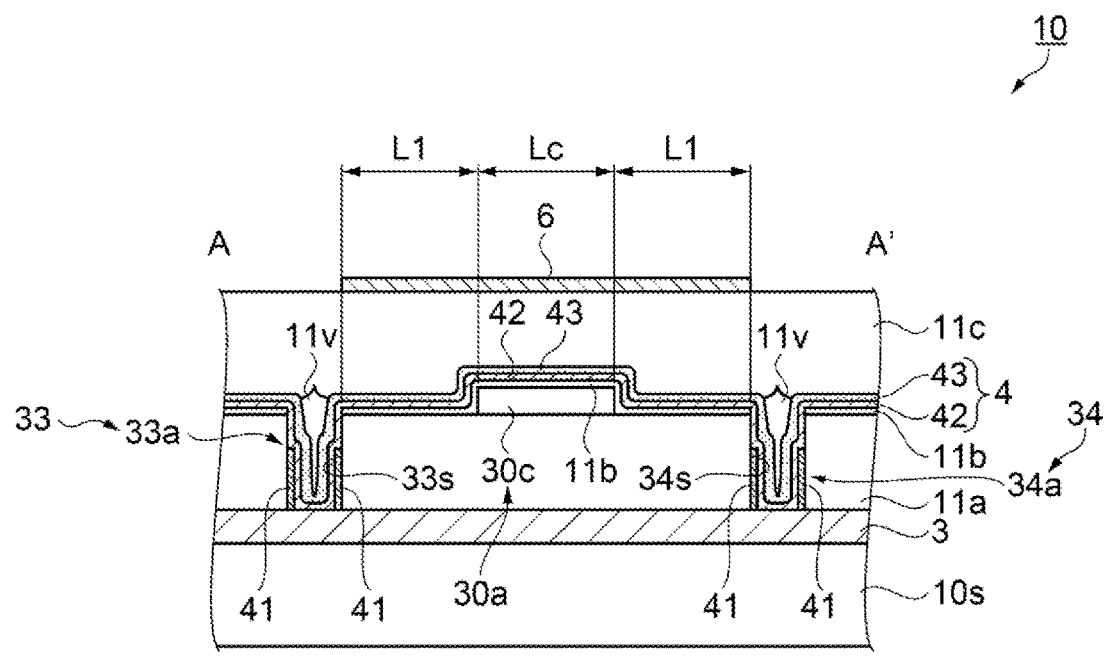
FIG. 7 is a cross-sectional view schematically illustrating a light-shielding structure of a transistor taken along line A-A' in FIG. 6.
Figure 8:
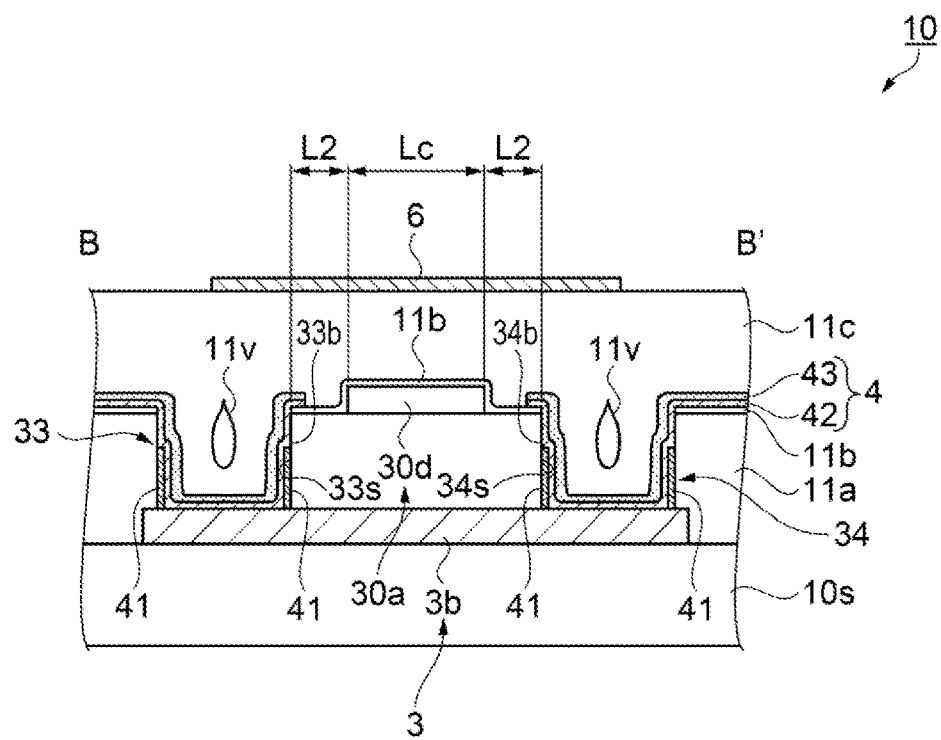
FIG. 8 is a cross-sectional view schematically illustrating a light-shielding structure of a transistor taken along line B-B' in FIG. 6.

Next, the light-shielding structure of the TFT 30 in the element substrate 10 of First Exemplary Embodiment will be described with reference to FIGS. 6 to 8. FIG. 6 is a plan view schematically illustrating an arrangement of transistors and signal wiring lines in the element substrate, FIG. 7 is a cross-sectional view schematically illustrating a light-shielding structure of a transistor along line A-A' in FIG. 6, and FIG. 8 is a cross-sectional view schematically illustrating a light-shielding structure of a transistor along line B-B' in FIG. 6. Note that the line A-A' in FIG. 6 is a line segment that crosses, in the X direction, a channel region 30c in the semiconductor layer 30a of the TFT 30, and the line B-B' in FIG. 6 is a line segment that crosses, in the X direction, a high concentration impurity region 30d in the semiconductor layer 30a of the TFT 30.

As illustrated in FIG. 6, the scanning line 3 includes a main line portion 3a that also extends in the X direction across a plurality of pixels P aligned in the X direction, and an extended portion 3b with extended widths in both the X direction and in the Y direction with respect to the main line portion 3a. The scanning line 3 also includes a protruded portion 3c protruding upward in the Y direction from the extended portion 3b, and a protruded portion 3d protruding downward in the Y direction from the extended portion 3b. The extended portion 3b is formed corresponding to the intersection of the non-opening regions illustrated in FIG. 5.

The semiconductor layer 30a of the TFT 30 is disposed along the Y direction to overlap in plan view with the extended portion 3b and the two protruded portions 3c and 3d of the scanning line 3.

The semiconductor layer 30a of First Exemplary Embodiment forms an LDD structure formed by selectively implanting impurity ions into the polysilicon film, for example. Specifically, the semiconductor layer 30a includes a channel region 30c, low concentration impurity regions 30e and 30f that interpose the channel region 30c, a high concentration impurity region 30s provided in contact with the low concentration impurity region 30e on one side, and a high concentration impurity region 30d provided in contact with the low concentration impurity region 30f on the other side. The high concentration impurity regions 30d and 30s are implanted with greater amount of impurity ions than the low concentration impurity regions 30e and 30f, to thus enhance the conductivity of the high concentration impurity regions 30d and 30s. A contact hole 31, configured for coupling the data line 6 with the high concentration impurity region 30s, is provided at an end portion of the high concentration impurity region 30s on one side. A contact hole 32, configured for coupling the first relay electrode 6b (see FIG. 4) with the high concentration impurity region 30d, is provided at an end portion of the high concentration impurity region 30d on the other side. Hereinafter, the low concentration impurity regions 30e and 30f are referred to as LDD regions 30e and 30f, respectively. The high concentration impurity region 30s at which the contact hole 31 is provided is referred to as a source region 30s, and the high concentration impurity region 30d at which the contact hole 32 is provided is referred to as a drain region 30d.

The semiconductor layer 30a is disposed such that, in plan view, the channel region 30c is located at the approximate center of the extended portion 3b of the scanning line 3 (in other words, the intersection of the non-opening regions). A wiring line 4 is disposed to overlap in plan view with the scanning line 3 and the semiconductor layer 30a thus configured. Specifically, the wiring line 4 includes, in plan view, a main line portion 4a that extends in the X direction to overlap with the main line portion 3a of the scanning line 3, and two extended portions 4b disposed on both sides along the semiconductor layer 30a and having widths extended with respect to the main line portion 4a, and a narrowed portion 4c disposed between the two extended portions 4b and having a width narrowed with respect to the main line portion 4a to overlap with the channel region 30c of the semiconductor layer 30a.

Two contact holes 33 and 34 are provided at the extended portion 3b of the scanning line 3 in order to electrically couple the scanning line 3 and the wiring line 4. The contact holes 33 and 34 are provided on both sides of the semiconductor layer 30a with the semiconductor layer 30a interposed in between in plan view. The narrowed portion 4c, which, in the wiring line 4, overlaps in plan view with the channel region 30c of the semiconductor layer 30a, serves as the gate electrode 30g in the TFT 30. Since the scanning signal is supplied to the wiring line 4 as well as the scanning line 3 via the contact holes 33 and 34, the scanning line 3 located at a lower layer than the semiconductor layer 30a is hereinafter referred to as a first scanning line 3, and the wiring line 4 located at an upper layer than the semiconductor layer 30a is referred to as a second scanning line 4. That is, the two contact holes 33 and 34 electrically couple the first scanning line 3 and the second scanning line 4. Note that only one of the two contact holes 33 and 34 may be provided to electrically couple the first scanning line 3 and the second scanning line 4. Although the second scanning line 4 is provided to enhance an electrical wiring system configured to supply the scanning signals, a configuration may be employed in which the gate electrode 30g is provided for each of the pixels P to overlap in plan view with the contact holes 33 and 34 and the channel region 30c, without being limited to the above.

The contact hole 33 on one side includes a body portion 33a disposed along the semiconductor layer 30a in plan view, and a protruded portion 33b protruding from the body portion 33a toward the source region 30s and the drain region 30d, which are high concentration impurity regions in addition to the channel region 30c. The contact hole 34 on the other side also includes a body portion 34a disposed along the semiconductor layer 30a in plan view, and a protruded portion 34b protruding from the body portion 34a toward the source region 30s and the drain region 30d, which are high concentration impurity regions. The two contact holes 33 and 34 are formed in a parenthesis shape ([ ]shape) in plan view with the semiconductor layer 30a interposed in between, where the protruded portions 33b and 34b protrude farther toward the source region 30s side than the boundary between the LDD region 30e and the source region 30s, and protrude farther toward the drain region 30d side than the boundary between the LDD region 30f and the drain region 30d.

Next, a structure of the contact holes 33 and 34 and a method of forming the structure will be described with reference to FIGS. 7 and 8.

As illustrated in FIGS. 7 and 8, the contact holes 33 and 34 include light-absorption layers 41 formed inside the respective contact holes 33 and 34, and a first conductive layer 42 and a second conductive layer 43 that are layered together to cover the light-absorption layers 41. The light-absorption layers 41 have a light-absorption property and is formed to be in contact with the underlying insulating layers 11a on the side walls of the respective contact holes 33 and 34. The first conductive layer 42 and the scanning line 3 are in a state of electrically coupled to each other at the bottom portion of the contact holes 33 and 34. The first conductive layer 42 and the second conductive layer 43 are formed covering the gate insulating layer 11b, and the first conductive layer 42 and the second conductive layer 43 constitute the second scanning line 4.

In First Exemplary Embodiment, the light-absorption layer 41 is configured to include an oxide of a metal and a silicide of a metal, where the metals are selected from titanium (Ti), zirconium (Zr), and hafnium (Hf). In First Exemplary Embodiment, the light-absorption layer 41 is configured to include an oxide ($TiO_2$) of Ti as a metal and a silicide (TiSix) of Ti. The portion of the light-absorption layer 41 constituted by the metal oxide ($TiO_2$) is not formed at the bottom surface of the contact holes 33 and 34, but is formed along a side wall 33s of the contact hole 33 and a side wall 34s of the contact hole 34, which are the boundary with the underlying insulating layers 11a. A method of forming the light-absorption layer 41 thus configured will be described below. Note that the underlying insulating layer 11a of First Exemplary Embodiment is an example of an insulating layer including a contact hole configured to electrically couple the scanning line and the gate electrode of the transistor in the present disclosure.

The first conductive layer 42 covering the light-absorption layer 41 inside the respective contact holes 33 and 34 includes, for example, a conductive polysilicon, and the second conductive layer 43 overlaid on the first conductive layer 42 includes, for example, a metal silicide. The second conductive layer 43 of First Exemplary Embodiment is composed of a tungsten silicide (WSi). Note that the second scanning line 4 is not limited to being a two-layer structure constituted by the first conductive layer 42 and the second conductive layer 43. For example, the second scanning line 4 may be a multilayer structure of layers including a silicide of a metal such as Ti or W (for example, a three-layer structure of WSi/TiSi/WSi). The first conductive layer 42 and the second conductive layer 43 are one example of the conductive layers in the present disclosure. In other words, the conductive layer of the present disclosure is not limited to being a single layer structure, and may be a multilayer structure including layers including conductive materials of different types.

The first interlayer insulating layer 11c is formed to cover the second scanning line 4 overlaid on the gate insulating layer 11b. A planarization treatment such as CMP treatment is conducted to alleviate unevenness occurred on the surface of the first interlayer insulating layer 11c by covering the second scanning line 4. The first interlayer insulating layer 11c, which is, for example, a silicon oxide film formed by a CVD method, has the average film thickness of 300 nm, for example, after the planarization treatment. Due to the difficulties for the first interlayer insulating layer 11c to completely fill the recessed portion occurred in each of the contact holes 33 and 34, a void 11v is formed between the second conductive layer 43 and the first interlayer insulating layer 11c inside the respective contact holes 33 and 34, in First Exemplary Embodiment. Note that it is technically possible to select the method of forming the first interlayer insulating layer 11c so that the void 11v may not occur.

The data line 6 is formed, at a position overlapping in plan view with the semiconductor layer 30a, on the first interlayer insulating layer 11c to which the planarization treatment has been conducted. As described above, the data line 6 is formed using a conductive film having a light-shielding property such as, for example, aluminum (Al), or an alloy or metal compound of Al, an impurity doped conductive polysilicon, or the like.

As illustrated in FIG. 7, the width Lc of the channel region 30c in the semiconductor layer 30a is 0.5 µm, for example. The distance L1 between the side surface of the channel region 30c and the body portions 33a and 34a of the contact holes 33 and 34 is approximately equal to the width Lc of the channel region 30c, where the distance L1 is 0.5 µm, for example.

As illustrated in FIG. 8, the distance L2 between the side surface of the drain region 30d of the semiconductor layer 30a and the protruded portions 33b and 34b of the contact holes 33 and 34 is less than the width Lc of the channel region 30c, where the distance L2 is 0.15 µm, for example.

As a method of forming the contact holes 33 and 34 thus configured, two through holes leading to the first scanning line 3 are firstly formed through the gate insulating layer 11b and the underlying insulating layer 11a at both sides with the semiconductor layer 30a interposed in between. Examples of the method of forming the through holes include a method such as dry etching. Next, a conductive film is formed covering the surface of the gate insulating layer 11b and the through holes, then, the conductive film is patterned, so that the conductive film may not reside on the semiconductor layer 30a and on the gate insulating layer 11b, that is, for example, the conductive film may only reside within the through holes. In First Exemplary Embodiment, a conductive film is formed using Ti among the metals selected from Ti, Hf, and Zr. The film thickness of the conductive film may approximately from 50 nm to 100 nm to cover the inner side of the through hole. Subsequently, a polysilicon film and a tungsten silicide film are formed and patterned to cover the conductive film composed of Ti, which is formed inside the through hole, to form the second scanning line 4 composed of the first conductive layer 42 and the second conductive layer 43 that are overlaid together. Examples of the method of forming the conductive film including Ti, the polysilicon film, and the tungsten silicide film include a sputtering method and a CVD method, for example. After the formation of the polysilicon film, a process involving a heat treatment at, for example, 600° C. or higher is performed, then, a portion of the conductive film including Ti is oxidized by reacting with the underlying insulating layer 11a including a silicon oxide film, to thus form an oxide film including Ti oxide ($TiO_2$) at portions being in contact with the side walls 33s and 34s of the through holes. In addition, the conductive film including the residual Ti is silicidized by reacting with the polysilicon film, resulting in a conductive film with high light-shielding performance. Such a process results in a light-absorption layer 41 that includes a Ti oxide film ($TiO_2$) having a light-absorption property at portions of the contact holes 33 and 34 along the side walls 33s and 34s. In addition, at the bottom portions of the contact holes 33 and 34, the first scanning line 3 and the second scanning line 4 come into contact state with each other via a conductive film (TiSi) with high light-shielding property. That is, a process involving a heat treatment at, for example, 600° C. or higher is performed after the formation of the polysilicon film, then, the conductive film including a metal (Ti) does not reside inside the respective contact holes 33 and 34. The light-absorption layer 41 of First Exemplary Embodiment, which is in a state including the metal oxide film ($TiO_2$) and the metal silicide (TiSi), is in a state where the light-absorption property is enhanced as compared to a case where the whole is composed of a metal and/or a metal silicide. In other words, the light-absorption layer 41 is in a state where the reflectivity is lowered. Note that, in FIGS. 7 and 8, the portions of the light-absorption layer 41 including the metal oxide film ($TiO_2$) are emphatically illustrated to make the portions recognizable.

In the liquid crystal device 100, light from the counter substrate 20 side transmitting the liquid crystal layer 50, incident on the element substrate 10, and proceeding toward the semiconductor layer 30a of the TFT 30 is blocked by the data line 6 or the second scanning line 4, by the wiring structure (light-shielding structure) in the element substrate 10 described above. On the other hand, even when light (display light) emitted from the element substrate 10 through the opening region of the pixel P is reflected by a structural body such as a light-polarization element, and is then incident again on the element substrate 10, the light proceeding to the semiconductor layer 30a of the TFT 30 is blocked by the first scanning line 3. Moreover, a part of the diffracted light, which is diffracted at the end portion of the first scanning line 3 and is then incident on the respective contact holes 33 and 34, is blocked by the first conductive layer 42 and the second conductive layer 43 formed inside the respective contact holes 33 and 34. Particularly because the light-absorption layer 41 is formed on the side walls 33s and 34s of the contact holes 33 and 34, a part of the diffracted light incident on the side walls 33s and 34s is absorbed by the light-absorption layer 41, thus reducing the reflections of the diffracted light at the side walls 33s and 34s. Accordingly, even when diffracted light enters between the semiconductor layer 30a and the respective contact holes 33 and 34, the reflection at the side walls 33s and 34s is reduced, thus causing the diffracted light to be hardly incident on the semiconductor layer 30a.

Figure 9:
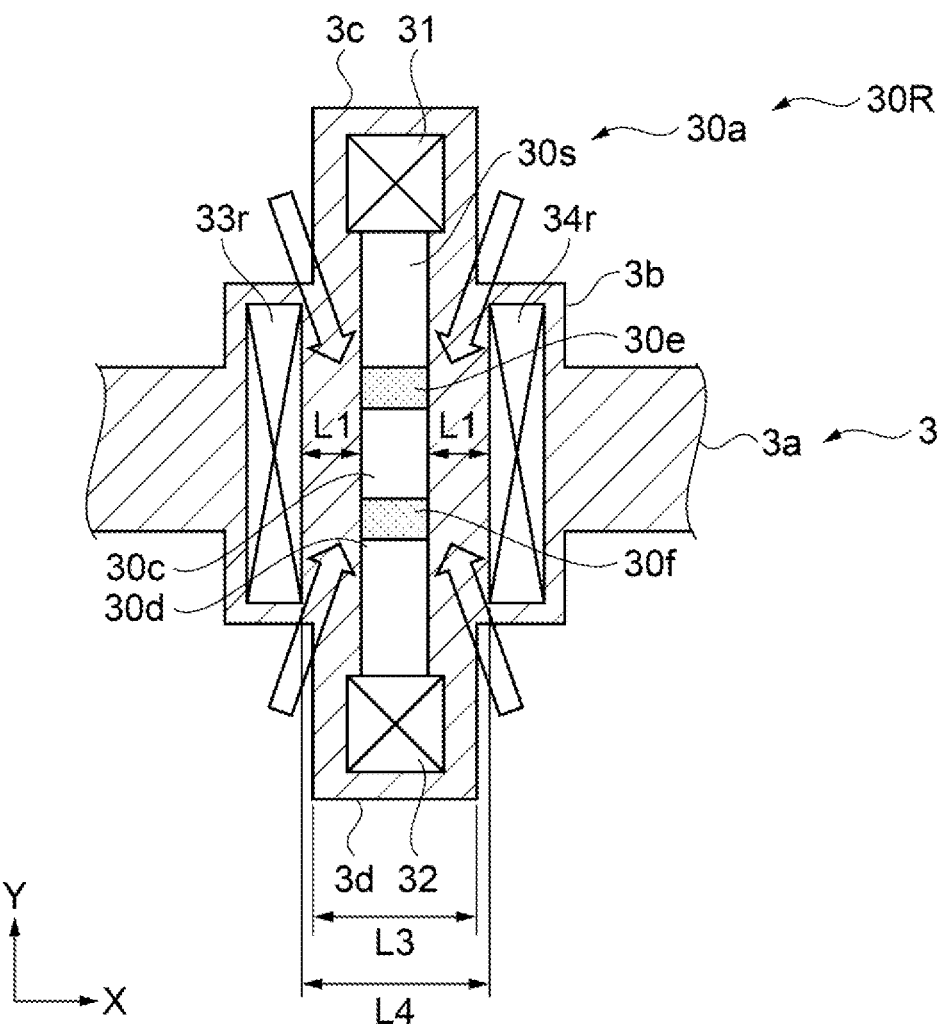
FIG. 9 is a plan view schematically illustrating an arrangement of contact holes for electrically coupling a gate of a transistor and a first scanning line according to a related art.
Figure 10:
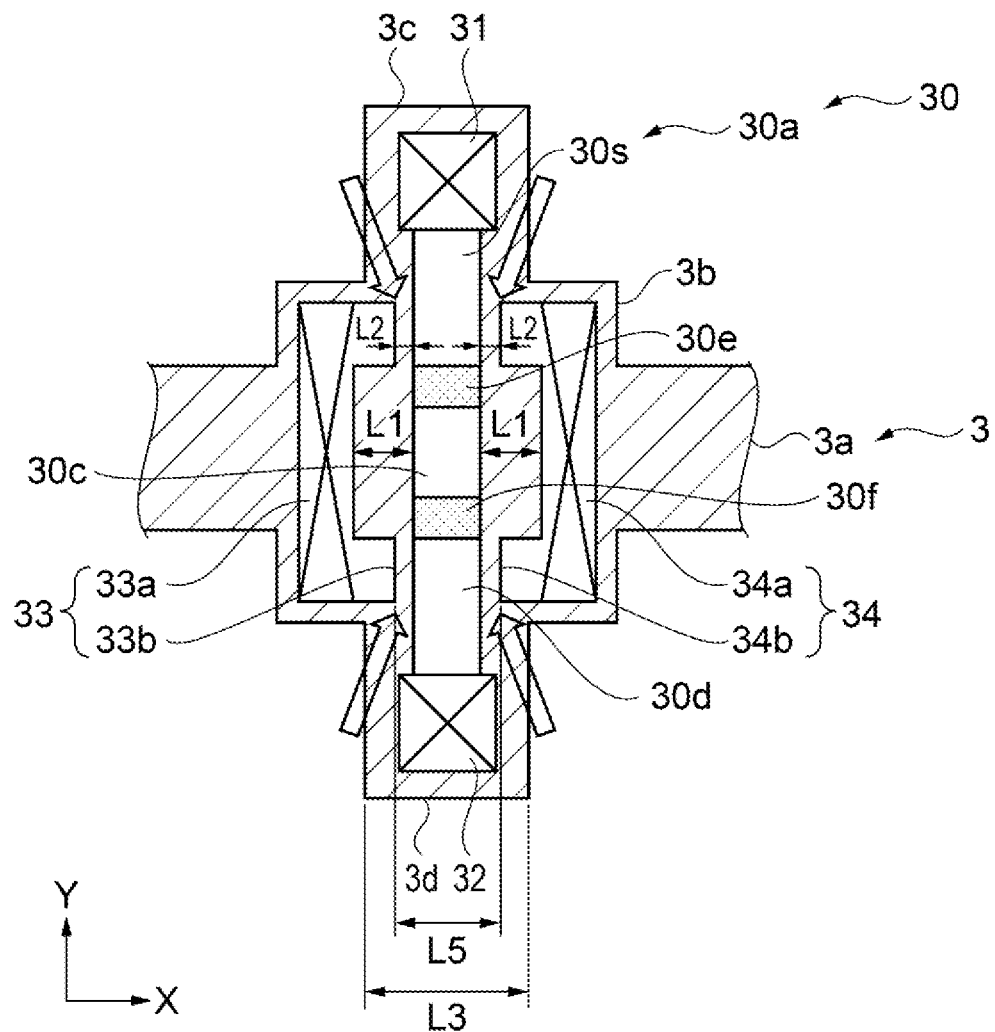
FIG. 10 is a plan view schematically illustrating an arrangement of contact holes for electrically coupling a gate of a transistor and a first scanning line according to First exemplary embodiment.

Next, the light-shielding property of the respective contact holes 33 and 34 with respect to the diffracted light of the first scanning line 3 will be described with reference to FIGS. 9 and 10. FIG. 9 is a plan view schematically illustrating an arrangement of contact holes for electrically coupling a gate of a transistor and a first scanning line according to a related art, and FIG. 10 is a plan view schematically illustrating an arrangement of contact holes for electrically coupling the gate of the transistor and the first scanning line according to First Exemplary Embodiment. Note that the configurations according to the related art that are the same as the configurations according to First Exemplary Embodiment are denoted by the same reference signs, and detailed description of the same configurations will be omitted.

Contact Holes According to Related Art

As illustrated in FIG. 9, contact holes 33r and 34r for electrically coupling a gate of a TFT 30R as a transistor according to a related art and the first scanning line 3 are disposed, in the extended portion 3b of the first scanning line 3, on both sides along the semiconductor layer 30a extending in the Y direction. The semiconductor layer 30a forms an LDD structure including a source region 30s, an LDD region 30e, a channel region 30c, an LDD region 30f, and a drain region 30d. The contact holes 33r and 34r extend, in the Y direction, along the semiconductor layer 30a and faces, in the X direction, a portion of the source region 30s at the LDD region 30e side, the LDD region 30e, the channel region 30c, the LDD region 30f, and a portion of the drain region 30d at the LDD region 30f side. The distance L1 in the X direction between the semiconductor layer 30a and the contact holes 33r and 34r is constant, where the distance L1 is, in this case, the same as the width in the X direction in the channel region 30c, which is 0.5 μm, for example.

Provided that the width in the X direction of the protruded portions 3c and 3d protruding in the Y direction from the extended portion 3b of the first scanning line 3 is L3, and the distance between two contact holes 33r and 34r facing each other in the X direction with the semiconductor layer 30a interposed in between is L4, the distance L4 is greater than the width L3 in the related art, which is, for example, 1.5 μm.

In such an arrangement of the contact holes 33r and 34r according to the related art, the diffracted light diffracted at the end portion of the first scanning line 3 readily enters the gap between the semiconductor layer 30a and the respective contact holes 33r and 34r, as indicated by the arrows in the figure. Although not illustrated in FIG. 9, a layered film of the first conductive layer 42 and the second conductive layer 43 that constitute the second scanning line 4 is provided inside the respective contact holes 33r and 34r in the related art. In other words, the light-absorption layer 41 is not provided. Accordingly, the diffracted light incident from the outer portion opposite to the inner portion facing the semiconductor layer 30a in the contact holes 33r and 34r is blocked by the contact holes 33r and 34r and does not reach the semiconductor layer 30a. On the other hand, the diffracted light having entered the gap between the semiconductor layer 30a and the contact holes 33r and 34r is incident on the semiconductor layer 30a as is, or is reflected by the side walls of the contact holes 33r and 34r and is then incident on the semiconductor layer 30a. In particular, the diffracted light may be readily incident on the LDD regions 30e and 30f located on the side closer to the end portion of the first scanning line 3 with respect to the channel region 30c, to thus generate an optical leakage current.

Contact Holes of First Exemplary Embodiment

As illustrated in FIG. 10, the contact holes 33 and 34 of First Exemplary Embodiment are provided at the extended portion 3b of the first scanning line 3, and are provided on both sides along the semiconductor layer 30a to form a parenthesis shape ([ ] shape), in plan view. The distance L1 in the X direction between the channel region 30c and the body portions 33a and 34a of the contact holes 33 and 34 is approximately equal to the width in the X direction of the channel region 30c, where the distance L1 is 0.5 µm, for example. The distance L2 in the X direction between the drain region 30d and the source region 30s, and the protruded portions 33b and 34b of the contact holes 33 and 34 is less than the distance L1, where the distance L2 is 0.15 µm, for example. Since the protruded portions 33b and 34b are disposed toward the drain region 30d and the source region 30s that are high concentration impurity regions, a state is realized in which the electric potential of the scanning signal in the contact holes 33 and 34 does not affect the electric potential of the source and the drain in the TFT 30, even when the distance L2 is set at approximately 0.15 µm. In other words, the distance L2 is minimized in the range where the electric potential of the scanning signal in the contact holes 33 and 34 does not affect the electric potential of the source and the drain in the TFT 30. In First Exemplary Embodiment, the distance L1 corresponds to the first distance in the present disclosure, and distance L2 corresponds to the second distance of the present disclosure. Accordingly, these terms may occasionally be referred to as the first distance L1 and the second distance L2, hereinafter.

Provided that the distance in the X direction between the protruded portions 33b and 34b of the contact holes 33 and 34 facing each other with the semiconductor layer 30a interposed in between is L5, the distance L5 is less than the width L3 in the X direction of the protruded portions 3c and 3d protruding in the Y direction from the extended portion 3b of the first scanning line 3, where the distance L5 is 0.8 µm, for example.

In the contact holes 33 and 34 thus configured of First Exemplary Embodiment, the second distance L2 between the semiconductor layer 30a and the protruded portions 33b and 34b of the contact holes 33 and 34 is less than the first distance L1, thus, the diffracted light diffracted at the end portion of the first scanning line 3 hardly enters the gap between the semiconductor layer 30a and the contact holes 33 and 34, compared to the related art, as indicated by the arrows in the figure. As described above, on the side walls of the contact holes 33 and 34 in First Exemplary Embodiment, the light-absorption layer 41, the first conductive layer 42, and the second conductive layer 43 are layered together in this order. Accordingly, the diffracted light incident on the body portions 33a and 34a along the semiconductor layer 30a in the contact holes 33 and 34 is blocked and absorbed by the contact holes 33 and 34, and does not reach the semiconductor layer 30a. On the other hand, even when the diffracted light enters the gap between the semiconductor layer 30a and the contact holes 33 and 34, the amount of the light is less than the related art, and the light hardly reaches the semiconductor layer 30a. In addition, because the light-absorption layer 41 is formed on the side walls of the contact holes 33 and 34, the diffracted light incident on the side walls of the contact holes 33 and 34 is absorbed and thus the reflections of the diffracted light hardly occur. Thus, the light-shielding structure is formed such that the optical leakage current of the TFT 30 due to the diffracted light generated at the end portion of the first scanning line 3 is suppressed from occurring, compared to the related art.

The liquid crystal device 100 of First Exemplary Embodiment described above can provide the following advantages.

(1) The contact holes 33 and 34 for electrically coupling the gate electrode 30g of the TFT 30 and the first scanning line 3 are provided on both sides along the semiconductor layer 30a of the TFT 30 to form a parenthesis ([ ]) shape in plan view. Specifically, the contact holes 33 and 34 include body portions 33a and 34a spaced apart from the channel region 30c of the semiconductor layer 30a by a first distance L1, and protruded portions 33b and 34b protruding from the body portions 33a and 34a toward the drain region 30d and the source region 30s that are high concentration impurity regions of the semiconductor layer 30a, and spaced apart from the drain region 30d and the source region 30s by a second distance L2 being less than the first distance L1. Accordingly, the diffracted light incident from the base material 10s side of the element substrate 10 and diffracted at the end portion of the first scanning line 3 hardly enters the channel region 30c side from between the semiconductor layer 30a and the protruded portions 33b and 34b. Thus, diffracted light is hardly incident on the LDD regions 30e and 30f that are in contact with the channel region 30c, and thus, the liquid crystal device 100 including a light-shielding structure in which an optical leakage current hardly occurs due to the diffracted light can be provided.

(2) The light-absorption layer 41 is provided inside the contact holes 33 and 34. In addition, the first conductive layer 42 and the second conductive layer 43 are layered together on the light-absorption layer 41. Accordingly, both light-absorption property and light-shielding property can be achieved with respect to the light incident on the contact holes 33 and 34.

(3) In the contact holes 33 and 34, the void 11v is formed between the second conductive layer 43 and the first interlayer insulating layer 11c. The light-shielding property with respect to the light incident on the contact holes 33 and 34 is enhanced compared to the case where no void 11v is formed, due to the void 11v that is a space, having a smaller refractive index than the second conductive layer 43.

SECOND EXEMPLARY EMBODIMENT

Electronic Apparatus

Figure 11:
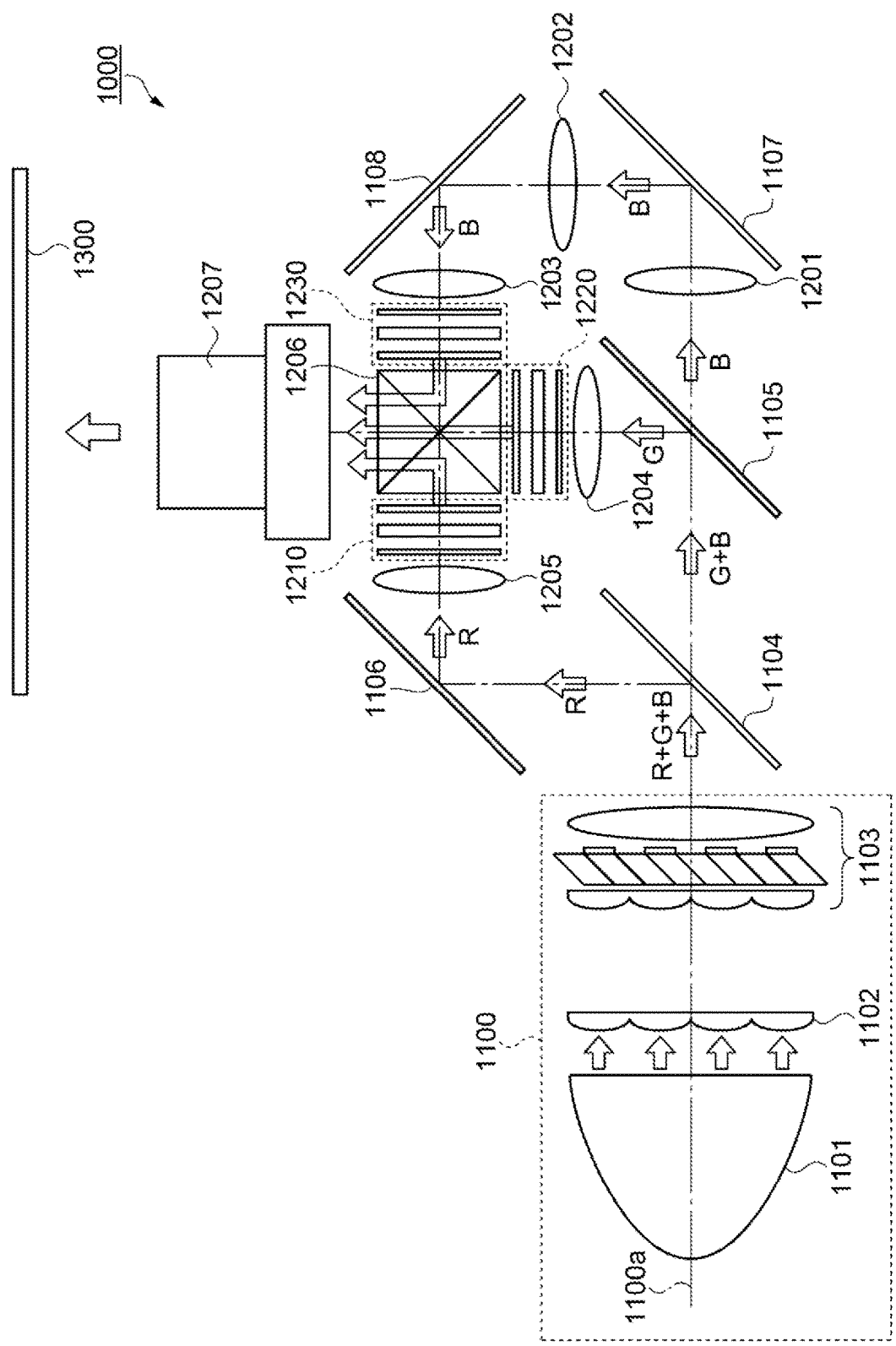
FIG. 11 is a view schematically illustrating a configuration of a projection-type display device as an electronic apparatus according to Second Exemplary Embodiment.

Next, a projection-type display device will be described as an example of an electronic apparatus according to Second Exemplary Embodiment. FIG. 11 is a view schematically illustrating a configuration of a projection-type display device as an electronic apparatus according to Second Exemplary Embodiment.

As illustrated in FIG. 11, a projection-type display device 1000 as an electronic apparatus according to Second Exemplary Embodiment includes a polarized light illumination device 1100, two dichroic mirrors 1104 and 1105 as light separation elements, three reflection mirrors 1106, 1107, and 1108, and five relay lenses 1201, 1202, 1203, 1204, and 1205, which are disposed along a system optical axis 1100a. The projection-type display apparatus 1000 further includes liquid crystal light valves 1210, 1220, and 1230 of a transmissive-type as three light modulation units, a cross dichroic prism 1206 as a photosynthetic element, and a projection lens 1207, which are disposed along the system optical axis 1100a passing through the relay lenses 1203, 1204, and 1205.

The polarized light illumination device 1100 is generally configured by a lamp unit 1101 as a light source composed of a white light source such as an extra-high pressure mercury lamp or a halogen lamp, an integrator lens 1102, and a polarization conversion element 1103.

The dichroic mirror 1104 reflects red light (R) of a polarized light flux emitted from the polarized light illumination device 1100 and transmits green light (G) and blue light (B). The other dichroic mirror 1105 reflects the green light (G) transmitted by the dichroic mirror 1104 and transmits the blue light (B).

The red light (R) reflected by the dichroic mirror 1104 is reflected by the reflection mirror 1106 and subsequently is incident on the liquid crystal light valve 1210 via the relay lens 1205.

The green light (G) reflected by the dichroic mirror 1105 is incident on the liquid crystal light valve 1220 via the relay lens 1204.

The blue light (B) transmitted by the dichroic mirror 1105 is incident on the liquid crystal light valve 1230 via a light guide system composed of three relay lenses 1201, 1202, and 1203 and two reflection mirrors 1107 and 1108.

The liquid crystal light valves 1210, 1220, and 1230 are each disposed to face an incident surface of each type of color light of the cross dichroic prism 1206. Each of the color light incident on the liquid crystal light valves 1210, 1220, and 1230 is modulated based on video information (video signal) and is emitted toward the cross dichroic prism 1206. In this prism, four rectangular prisms are bonded together, and on the inner surfaces of the prisms, a dielectric multilayer film configured to reflect red light and a dielectric multilayer film configured to reflect blue light are formed in a cross shape. Three types of color light are synthesized by these dielectric multilayer films, and light representing a color image is synthesized. The synthesized light is projected onto a screen 1300 by the projection lens 1207 as a projection optical system, and an image is enlarged and displayed.

The liquid crystal light valve 1210 is a valve to which the liquid crystal device 100 of First Exemplary Embodiment described above is applied. A pair of light-polarization elements disposed in a crossed-Nicols state on the incident side and the emission side of the color light of the liquid crystal panel 110 are disposed with a gap interposed between the pair of light-polarization elements. The same applies to the other liquid crystal light valves 1220 and 1230.

According to the projection-type display device 1000 thus configured, the liquid crystal device 100 is used as the liquid crystal light valves 1210, 1220, and 1230, thus, a generation of an optical leakage current in the TFT 30 is suppressed even when intense color light is incident on the pixel P, and thus, the projection-type display device 1000 enabling a bright display and achieving a stable display state can be provided.

Note that the projection-type display device 1000 according to Second Exemplary Embodiment uses, but not limited to, a white light source such as an extra-high pressure mercury lamp, a halogen lamp, or the like. For example, the projection-type display apparatus 1000 may use, for example, a solid-state light source such as a laser light source and an LED compatible with each of red light (R), green light (G), and blue light (B).

The disclosure is not limited to the exemplary embodiments described above, and various modifications and improvements may be added to the exemplary embodiments described above. Modified examples will be described below.

Modified Example 1

Figure 12:
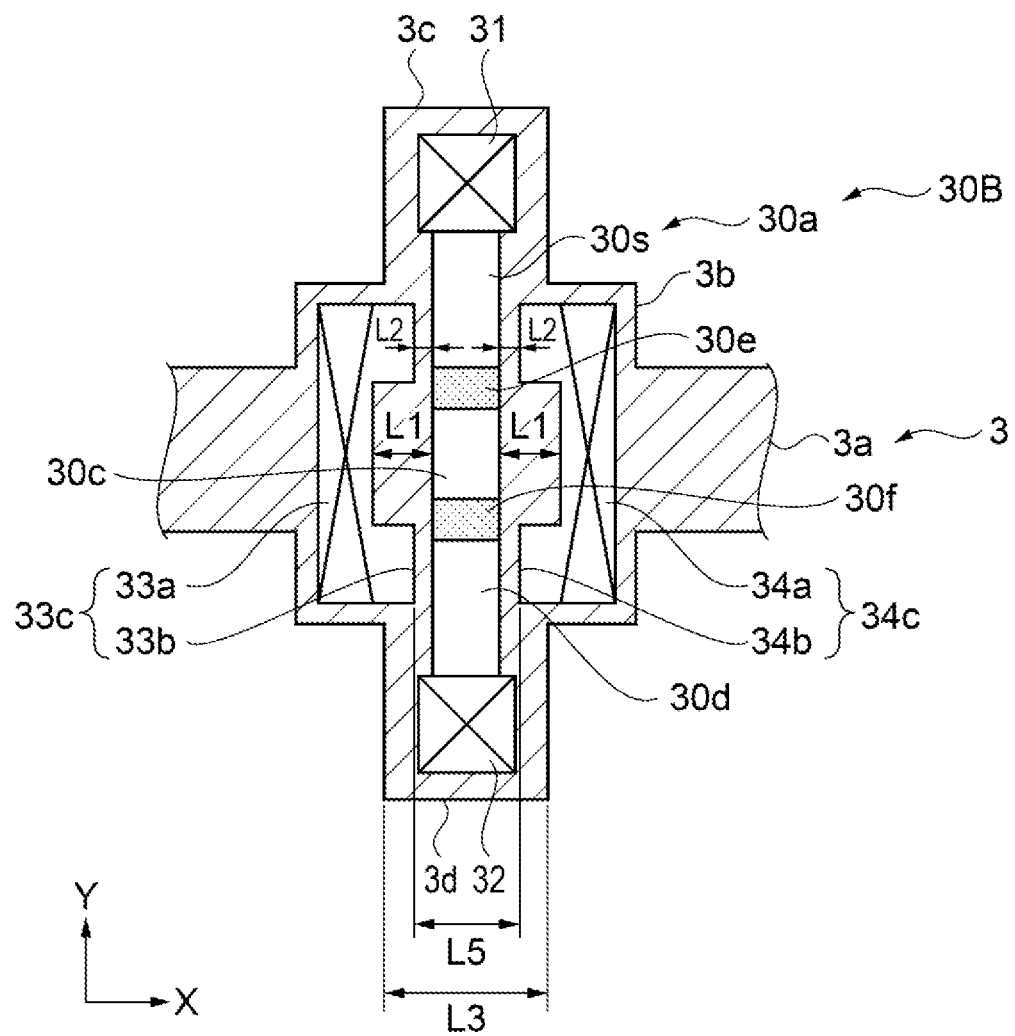
FIG. 12 is a plan view schematically illustrating an arrangement of contact holes related to a gate of a transistor according to a modified example.

In the liquid crystal device 100 of First Exemplary Embodiment described above, a planar arrangement of the contact holes 33 and 34 with respect to the semiconductor layer 30a of the TFT 30 is not limited to the planar arrangement described above. FIG. 12 is a plan view schematically illustrating an arrangement of contact holes related to a gate of a transistor according to the modified example. For example, as illustrated in FIG. 12, a TFT 30B as a transistor of the modified example includes a semiconductor layer 30a of an LDD structure. The semiconductor layer 30a is disposed extending, in the Y direction, in the extended portion 3b of the first scanning line 3. Contact holes 33c and 34c for electrically coupling a gate of the TFT 30B and the first scanning line 3 is disposed on both sides, in the X direction, along the semiconductor layer 30a. The contact holes 33c and 34c include body portions 33a and 34a spaced apart from the channel region 30c of the semiconductor layer 30a by a first distance L1, and protruded portions 33b and 34b protruding from the body portions 33a and 34a toward a region provided across the LDD region 30e and the source region 30s on one side, and from the body portions 33a and 34a toward a region provided across the LDD region 30f and the drain region 30d on the other side. The second distance L2 between the semiconductor layer 30a and the protruded portions 33b and 34b is less than the first distance L1 described above. In the contact holes 33c and 34c in the modified example, the length in the Y direction of the protruded portions 33b and 34b is greater than the contact holes 33 and 34 of First Exemplary Embodiment described above. According to the contact holes 33c and 34c thus configured of the modified example, even when diffracted light diffracted at the end portion of the first scanning line 3 enters the gap between the semiconductor layer 30a and the respective contact holes 33c and 34c, the diffracted light is hardly incident on the channel region 30c and the LDD regions 30e and 30f on the side in contact with the channel region 30c, as compared to First Exemplary Embodiment described above. That is, a generation of an optical leakage current at the TFT 30B can be further suppressed. Note that the protruded portions 33b and 34b in the contact holes 33c and 34c of the modified example 1 protrude toward parts of the LDD regions 30e and 30f, and thus, an influence of the electric potential of the scanning signal on the LDD regions 30e and 30f needs to be taken into consideration. Accordingly, the second distance L2 between the protruded portions 33b and 34b and the semiconductor layer 30a in the modified example 1 may be greater than the second distance L2 (approximately 0.15 μm) between the protruded portions 34b and 33b of the contact holes 33 and 34 and the semiconductor layer 30a in First Exemplary Embodiment described above, where the second distance L2 of the modified example 1 is set at approximately 0.20 μm, for example.

Modified Example 2

Figure 13:
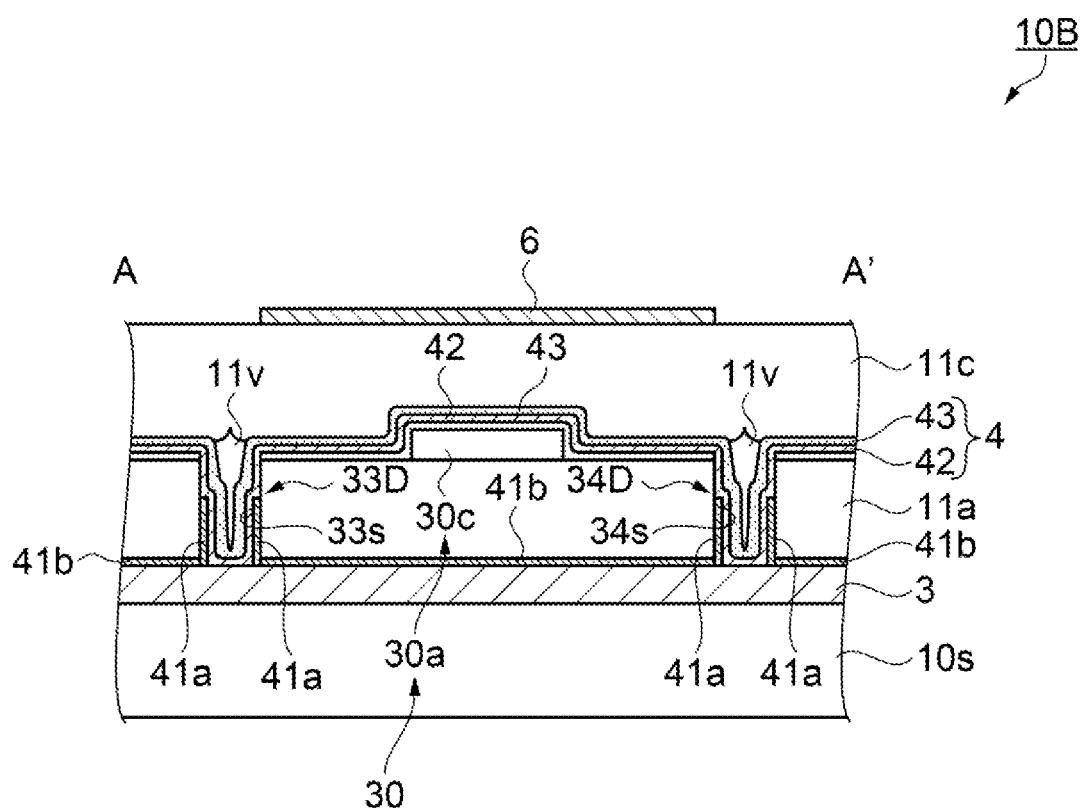
FIG. 13 is a cross-sectional view schematically illustrating a light-shielding structure of a transistor in an element substrate according to a modified example.

In the liquid crystal device 100 of First Exemplary Embodiment described above, the light-absorption layer 41 is provided inside the contact holes 33 and 34 for electrically coupling the gate electrode 30g of the TFT 30 and the first scanning line 3. However, the location where the light-absorption layer 41 is provided is not limited to the inner side of the contact holes 33 and 34 alone. FIG. 13 is a cross-sectional view schematically illustrating a light-shielding structure of a transistor in an element substrate of the modified example. Specifically, FIG. 13 is a schematic cross-sectional view corresponding to FIG. 7, which is referenced in First Exemplary Embodiment described above. As illustrated in FIG. 13, an element substrate 10B of the modified example 2 includes contact holes 33D and 34D for electrically coupling the first scanning line 3 and the second scanning line 4. A light-absorption layer 41a is formed inside the contact holes 33D and 34D. The first conductive layer 42 and the second conductive layer 43 are layered together with respect to the light-absorption layer 41a to configure the second scanning line 4. In addition, a light-absorption layer 41b is formed between the first scanning line 3 and the underlying insulating layer 11a. The light-absorption layers 41a and 41b include a metal oxide and a metal silicide, where a metal oxide film including the metal oxide is disposed at the side walls 33s and 34s of the contact holes 33D and 34D and the boundary face between the first scanning line 3 and the underlying insulating layer 11a (excluding the bottom portion of the contact holes 33D and 34D). According to such a configuration of the element substrate 10B of the modified example 2, light incident on the side walls 33s and 34s of the contact holes 33D and 34D is absorbed by the light-absorption layer 41a. Further, a part of the light diffracted at the end portion of the first scanning line 3 and caused to proceed to the semiconductor layer 30a side is absorbed by the light-absorption layer 41b. That is, with respect to the element substrate 10 of First Exemplary Embodiment described above, the element substrate 10B of the modified example 2 includes a light-shielding structure of the TFT 30 that can further suppress a generation of an optical leakage current of the TFT 30 related to the diffracted light of the first scanning line 3. Note that a configuration may be employed in which the light-absorption layer 41b is provided on the underlying insulating layer 11a side of the first scanning line 3 without providing of the light-absorption layer 41a inside the contact holes 33D and 34D.

Modified Example 3

The electro-optical device to which the light-shielding structure of a thin film transistor according to First Exemplary Embodiment described above is applicable is not limited to the liquid crystal device 100. For example, in a display device provided with a light-emitting element such as an organic EL element in a pixel, the light-shielding structure described above can also be applied to a thin film transistor configured for driving the light-emitting element.

Modified Example 4

The electronic apparatus to which the liquid crystal device 100 of First Exemplary Embodiment described above is applied is not limited to the projection-type display device 1000 of Second Exemplary Embodiment described above. For example, the liquid crystal device 100, by being configured to include a color filter having a coloring layer in a pixel as a liquid crystal device, can be used suitably as, for example, a display unit of a projection-type head-up display (HUD), a direct view-type head-mounted display (HMD), an electronic book, a personal computer, a digital still camera, a liquid crystal television, a view finder-type or monitor direct view-type video recorder, a car navigation system, an electronic diary, an information terminal device such as POS, or the like.

Below, contents derived from the exemplary embodiments will be described.

An electro-optical device according to the present application includes a substrate, a transistor, a scanning line between the substrate and the transistor, and an insulating layer including a contact hole configured to electrically couple the scanning line and a gate electrode of the transistor, wherein the contact hole includes a body portion provided, in plan view, along a semiconductor layer of the transistor and spaced apart from a channel region of the semiconductor layer by a first distance, and a protruded portion configured to protrude from the body portion toward a region other than the channel region of the semiconductor layer and to be spaced apart from the region other than the channel region by a second distance, which is less than the first distance.

According to the configuration of the present application, light traveling from the substrate side toward the semiconductor layer of the transistor is blocked by the scanning line. In addition, even when diffracted light incident from the substrate side and diffracted at the end portion of the scanning line goes around the scanning line, the contact hole, which electrically couples the scanning line and the gate electrode, is provided along the semiconductor layer, thus, the diffracted light hardly enters the channel region of the semiconductor layer and a region being in contact with the channel region. That is, this enables for a provision of an electro-optical device in which a generation of an optical leakage current of a transistor due to diffracted light of a scanning line is suppressed.

In the electro-optical device described above, the contact hole may be provided on both sides of the semiconductor layer, in plan view.

According to the above configuration, diffracted light entering a channel region and a region being in contact with the channel region from both sides of the semiconductor layer can be suppressed.

In the electro-optical device described above, the semiconductor layer may include the channel region, low concentration impurity regions provided to interpose the channel region, and a high concentration impurity region provided in contact with the low concentration impurity region, and the protruded portion in the contact hole may protrude toward the high concentration impurity region side of a boundary between the low concentration impurity region and the high concentration impurity region.

According to the above configuration, even when the protruded portion of the contact hole having a gate potential is brought closer to the high concentration impurity region of the semiconductor layer, this hardly affects the electric potential of the high concentration impurity region, thus, the second distance to the protruded portion of the contact hole can be further reduced to further suppress the entrance of the diffracted light.

In the electro-optical device described above, the semiconductor layer may include the channel region, low concentration impurity regions provided to interpose the channel region, and a high concentration impurity region provided in contact with the low concentration impurity region, and the protruded portion in the contact hole may protrude toward a region extending across the low concentration impurity region and the high concentration impurity region.

According to the above configuration, the protruded portion of the contact hole, which is disposed close to the low concentration impurity region of the semiconductor layer, efficiently suppresses the diffracted light from entering the low concentration impurity region of the semiconductor layer.

In the electro-optical device described above, a light-absorption layer may be provided inside the contact hole.

According to the above configuration, the reflections of the light incident on the contact hole are suppressed to reduce a generation of so-called stray light. That is, a generation of an optical leakage current of a transistor due to stray light can be suppressed.

In the electro-optical device described above, the light-absorption layer may include an oxide of a metal selected from among Ti, Zr, and Hf, and the oxide of the metal may be provided along a side wall inside the contact hole.

According to the above configuration, reflections of light at the side wall of the contact hole can be suppressed.

In the electro-optical device described above, a light-absorption layer may be provided between the scanning line and the insulating layer on the substrate of the electro-optical device.

According to the above configuration, a part of the diffracted light diffracted by the end portion of the scanning line and proceeds toward the semiconductor layer can be absorbed by the light-absorption layer provided between the scanning line and the insulating layer.

In the electro-optical device described above, the light-absorption layer provided between the scanning line and the insulating layer may include an oxide of a metal selected from among Ti, Zr, and Hf, and the oxide of the metal may be provided only at an interface between the scanning line and the insulating layer.

According to the above configuration, reflections of light at the boundary face between the scanning line and the insulating layer can be suppressed.

The electro-optical device described above may include a conductive layer covering the light-absorption layer inside the contact hole.

According to the above configuration, a contact hole with both high light-shielding property and conductivity, in addition to the light-absorption property, can be provided.

In the electro-optical device described above, a void may be formed inside the contact hole.

According to the above configuration, the void that is a space, has a refractive index less than the light-absorption layer or the conductive layer, thus, enhancing the light-absorption property of the contact hole.

An electronic apparatus according to the present application includes the electro-optical device described above.

According to the configuration of the present application, an electro-optical device having a light-shielding structure that reliably blocks light incident on a transistor serving as a switching element of a pixel is provided, thus making it possible to provide an electronic apparatus enabling a stable operation even with a bright light source, for example.

What is claimed is:

1. An electro-optical device comprising:
    a substrate;
    a transistor including a gate electrode and a semiconductor layer;
    a scanning line between the substrate and the transistor; and
    an insulating layer including a contact hole configured to electrically connect the scanning line and the gate electrode, wherein
    the contact hole includes
    a body portion provided, in plan view, along the semiconductor layer and spaced apart from a channel region of the semiconductor layer by a first distance, and
    a protruded portion configured to protrude from the body portion toward a region other than the channel region of the semiconductor layer and to be spaced apart from the region other than the channel region by a second distance, which is less than the first distance.

2. The electro-optical device according to claim 1, wherein the contact hole is provided, in plan view, on both sides of the semiconductor layer.

3. The electro-optical device according to claim 1, wherein
    the semiconductor layer includes the channel region, low concentration impurity regions provided to interpose the channel region therebetween and a high concentration impurity region provided in contact with the low concentration impurity region, and
    the protruded portion in the contact hole protrudes toward the high concentration impurity region side of a boundary between the low concentration impurity region and the high concentration impurity region.

4. The electro-optical device according to claim 1, wherein
    the semiconductor layer includes the channel region, low concentration impurity regions provided to interpose the channel region therebetween, and a high concentration impurity region provided in contact with the low concentration impurity region, and the protruded portion in the contact hole protrudes toward a region extending across the low concentration impurity region and the high concentration impurity region.

5. The electro-optical device according to claim 1, wherein a light-absorption layer is provided inside the contact hole.

6. The electro-optical device according to claim 5, wherein
    the light-absorption layer includes an oxide of a metal selected from among Ti, Zr, and Hf, and
    the oxide of the metal is provided along a side wall inside the contact hole.

7. The electro-optical device according to claim 5, comprising a conductive layer covering the light-absorption layer inside the contact hole.

8. The electro-optical device according to claim 5, wherein a void is formed inside the contact hole.

9. The electro-optical device according to claim 5, wherein
    the light-absorption layer includes an oxide of a metal and a silicide of the metal,
    the oxide of the metal is provided along a side wall inside the contact hole, and
    the silicide of the metal is provided in a layer between the gate electrode and the oxide of the metal inside the contact hole.

10. The electro-optical device according to claim 1, wherein a light-absorption layer is provided between the scanning line and the insulating layer on the substrate.

11. The electro-optical device according to claim 10, wherein the light-absorption layer provided between the scanning line and the insulating layer includes an oxide of a metal selected from among Ti, Zr, and Hf, and the oxide of the metal is provided only at an interface between the scanning line and the insulating layer.

12. The electro-optical device according to claim 1, wherein the insulating layer includes another contact hole configured to electrically connect the scanning line and the gate electrode, the other contact hole including a body portion provided, in plan view, along the semiconductor layer and being spaced apart from the body portion of the contact hole by a third distance, and the scanning line includes a first portion that extends in a first direction and a second portion that protrudes from the first portion in a second direction that intersects the first direction, the width of the second portion is narrower than the third distance.

13. An electronic apparatus comprising the electro-optical device according to claim 1.

14. The electro-optical device according to claim 1, wherein the contact hole is spaced apart from the semiconductor layer in plan view.

15. The electro-optical device according to claim 1, wherein the insulating layer is provided in a layer between the gate electrode and the scanning line.

\* \* \* \* \*